United States Patent
Takashima

(10) Patent No.: US 9,025,369 B2
(45) Date of Patent: May 5, 2015

(54) RESISTANCE CHANGE NONVOLATILE SEMICONDUCTOR MEMORY DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 332 days.

(21) Appl. No.: 13/424,201

(22) Filed: Mar. 19, 2012

(65) Prior Publication Data

US 2012/0243307 A1    Sep. 27, 2012

(30) Foreign Application Priority Data

Mar. 23, 2011 (JP) .................. 2011-064931

(51) Int. Cl.
*G11C 11/00* (2006.01)
*H01L 45/00* (2006.01)
*H01L 27/24* (2006.01)
*G11C 11/56* (2006.01)
*G11C 13/00* (2006.01)

(52) U.S. Cl.
CPC ............ *H01L 45/08* (2013.01); *H01L 27/2436* (2013.01); *H01L 27/2463* (2013.01); *H01L 27/2472* (2013.01); *H01L 45/06* (2013.01); *H01L 45/085* (2013.01); *H01L 45/122* (2013.01); *H01L 45/1226* (2013.01); *H01L 45/1286* (2013.01); *H01L 45/143* (2013.01); *H01L 45/144* (2013.01); *H01L 45/146* (2013.01); *H01L 45/147* (2013.01); *G11C 11/5678* (2013.01); *G11C 13/0004* (2013.01); *G11C 13/003* (2013.01); *G11C 13/0038* (2013.01); *G11C 13/0064* (2013.01); *G11C 13/0069* (2013.01); *G11C 2013/008* (2013.01); *G11C 2213/75* (2013.01); *G11C 2213/79* (2013.01)

(58) Field of Classification Search
CPC .. G11C 14/004; G11C 14/0045; G11C 19/34; G11C 13/0004; G11C 11/5678
USPC .......... 365/148, 158, 163, 171, 173; 257/2, 3, 257/5, 62, 529, 530
See application file for complete search history.

(56) References Cited

U.S. PATENT DOCUMENTS

| 6,826,072 B2 | 11/2004 | Takashima |
| 7,208,751 B2 * | 4/2007 | Ooishi ............................ 257/5 |
| 7,414,879 B2 * | 8/2008 | Asao et al. .................... 365/158 |

(Continued)

FOREIGN PATENT DOCUMENTS

| JP | 2007-036187 | 2/2007 |
| JP | 2010-027984 | 2/2007 |

(Continued)

OTHER PUBLICATIONS

Office Action with English translation of Japanese Application No. 2011-064931, mailed Jul. 2, 2013.

(Continued)

*Primary Examiner* — Thao H Bui
(74) *Attorney, Agent, or Firm* — Knobbe, Martens, Olson & Bear, LLP

(57) ABSTRACT

According to one embodiment, a phase change memory includes a memory cell, a select transistor, and a memory cell array. The memory cell includes a chalcogenide wiring, resistance wirings and a cell transistor. The chalcogenide wiring becomes a heater. One end of a plurality of memory cells with sources and drains connected in series is connected to a source of the select transistor. The bit line is connected a drain of the select transistor. The memory cell array is obtained by forming a memory cell string.

29 Claims, 34 Drawing Sheets

(56) References Cited

U.S. PATENT DOCUMENTS

| | | |
|---|---|---|
| 7,742,331 B2 | 6/2010 | Watanabe |
| 8,129,709 B2 | 3/2012 | Seko et al. |
| 2009/0067229 A1* | 3/2009 | Kang et al. ............... 365/163 |

FOREIGN PATENT DOCUMENTS

| | | |
|---|---|---|
| JP | 2008-251059 | 10/2008 |
| JP | 2010-123664 | 6/2010 |

OTHER PUBLICATIONS

Chen, et al., "Ultra-thin Phase-Change Bridge Memory Device Using GeSb," Electron Devices Meeting, IEDM 2006.

Kim et al., "High Performance PRAM Cell Scalable to sub-20nm technology with below $4F^2$ Cell Size, Extendable to DRAM Applications," IEEE 2010 Symposium on VLSI Technology Digest of Technical Papers pp. 203-204.

Villa et al., "A 45nm 1Gb 1.8V Phase-Change Memory," 2010 IEEE International Solid-State Circuits Conference.

Bez, "Chalcogenide PCM: a Memory Technology for Next Decade," 2009 IEEE, IEDM Sep. 1989, pp. 89-92.

Fugazza et al., "Distributed-Poole-Frenkle modeling of anomalous resistance scaling and fluctuations in phase-change memory (PCM) devices," 2009 IEEE, IEDM09, pp. 723-726.

Lee, et. al., "Programming Disturbance and Cell Scaling in Phase Change Memory: For up to 16nm based $4F^2$ Cell," 2010 Symposium on VLSI Technology Digest of Technical Papers, pp. 199-2000.

Ha et al., "An Edge Contact Type Cell for Phase Change RAM Featuring Very Low Power Consumption," 2003 Symposium on VLSI Technology Digest of Technical Papers, pp. 175-176.

* cited by examiner

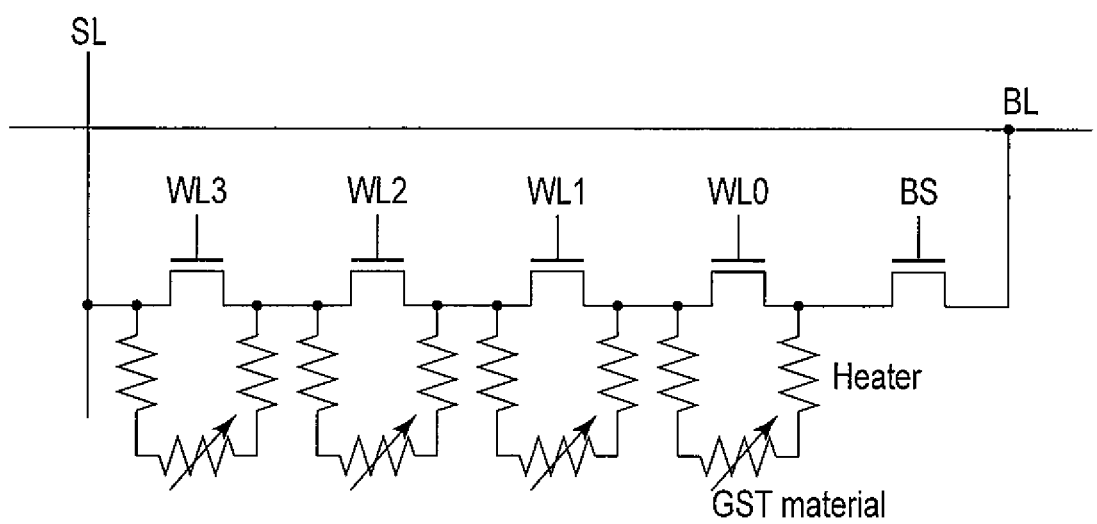
F I G. 1

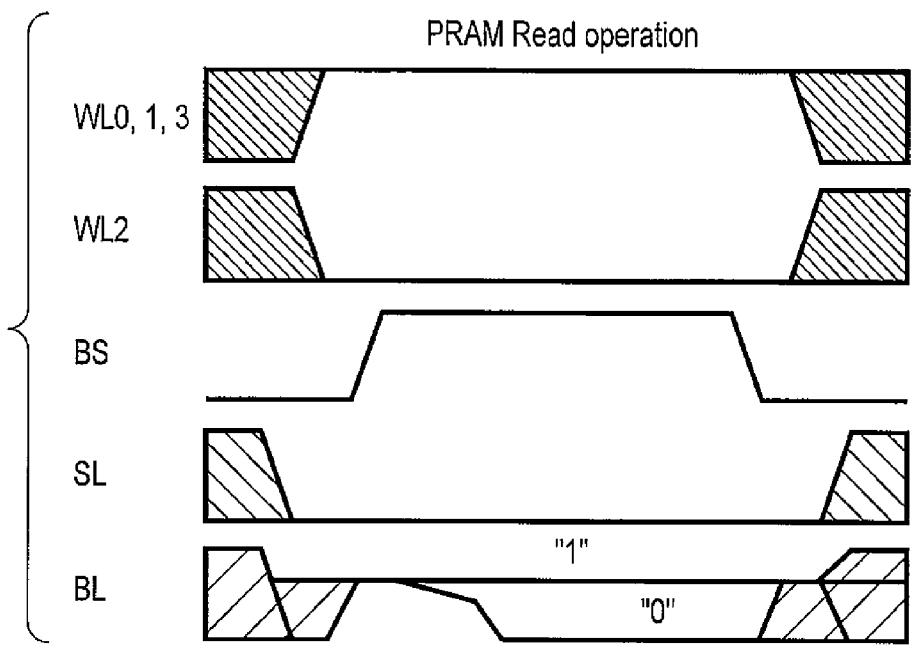
F I G. 3
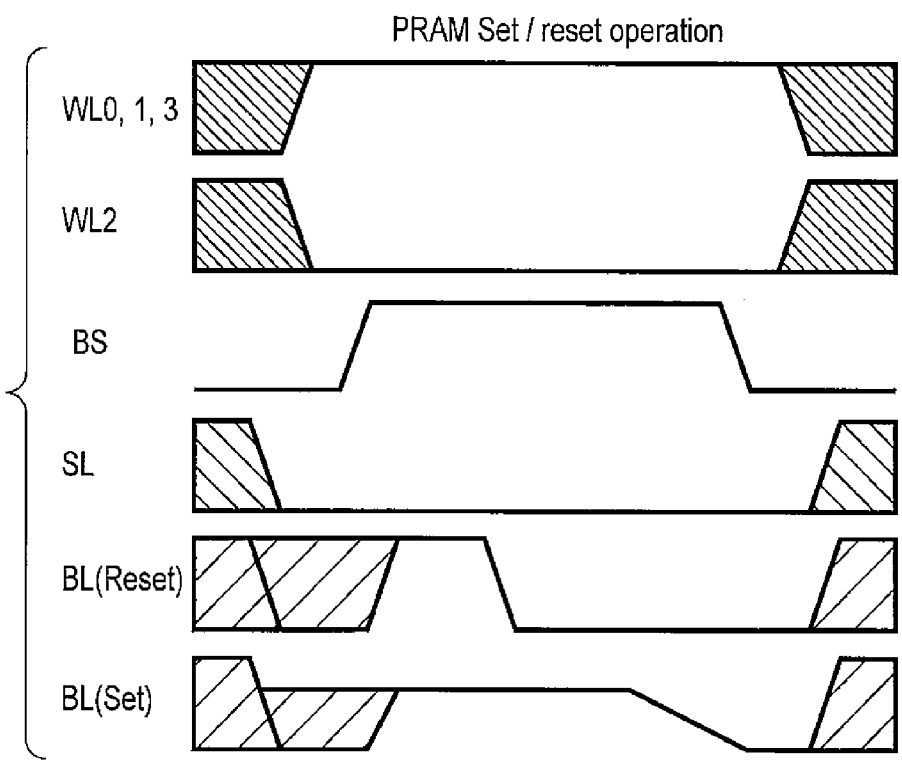
F I G. 4

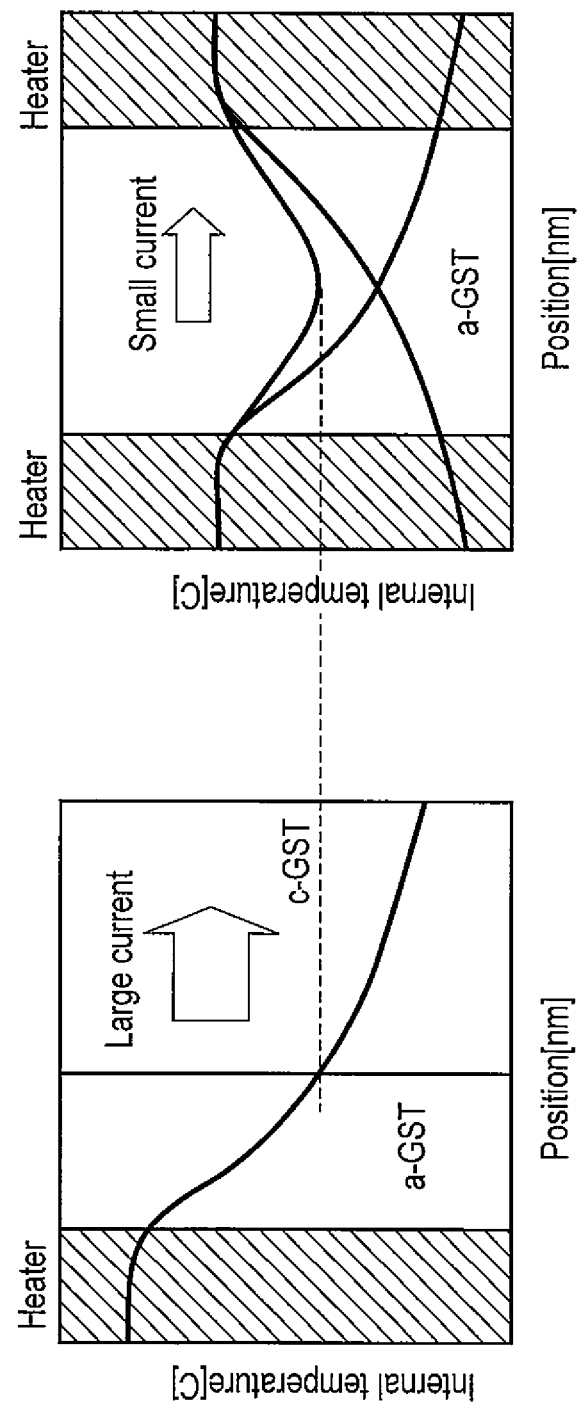
FIG. 8B Arrangement of heater on one side of GST
FIG. 8A Arrangement of heaters on both sides of GST

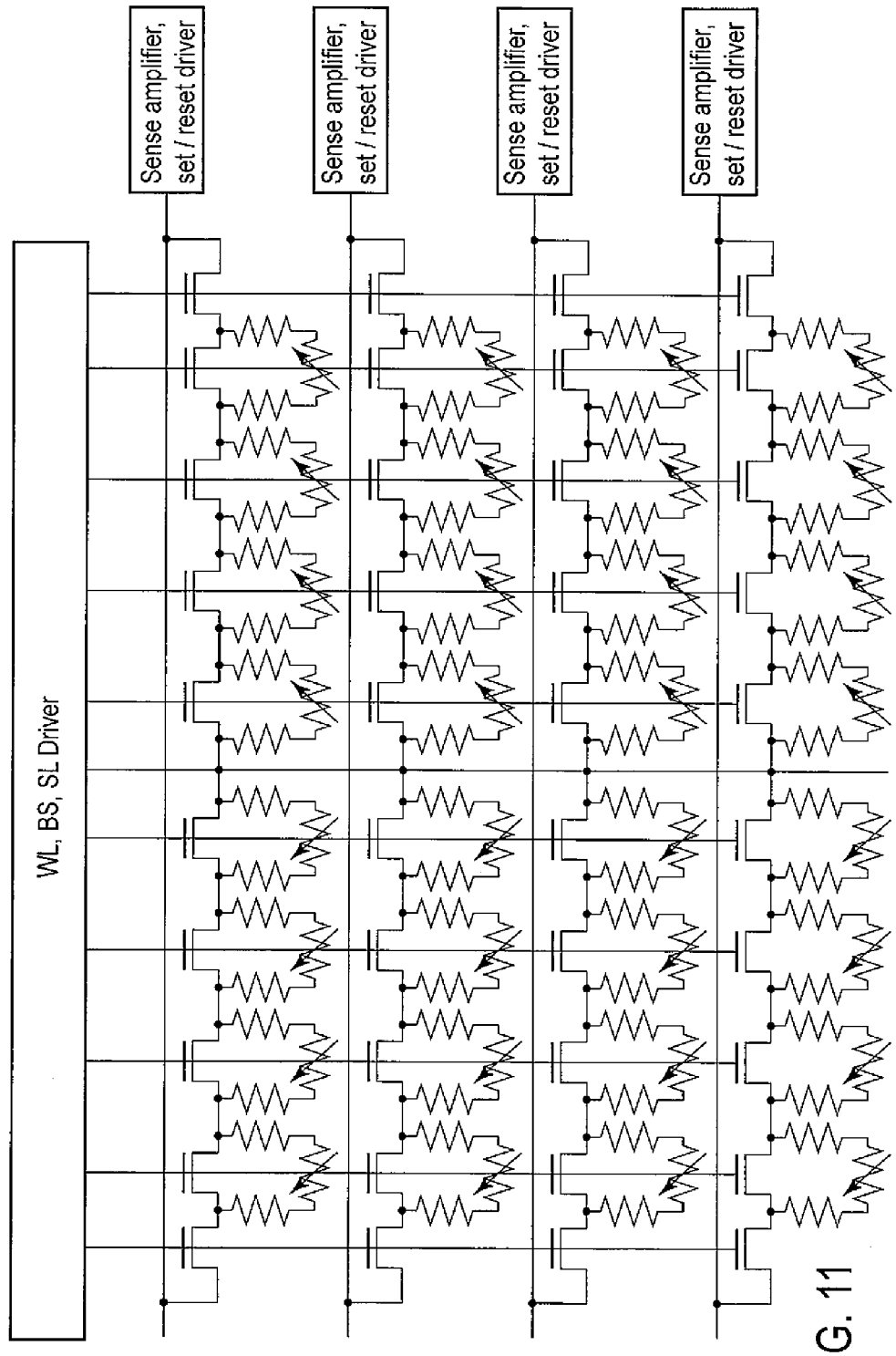
F I G. 11

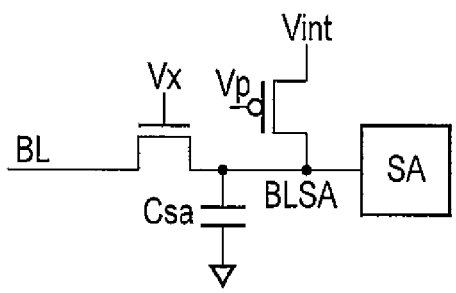
F I G. 12A
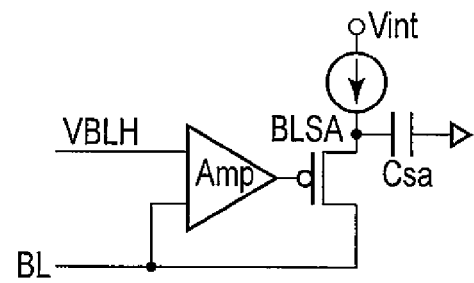
F I G. 12B
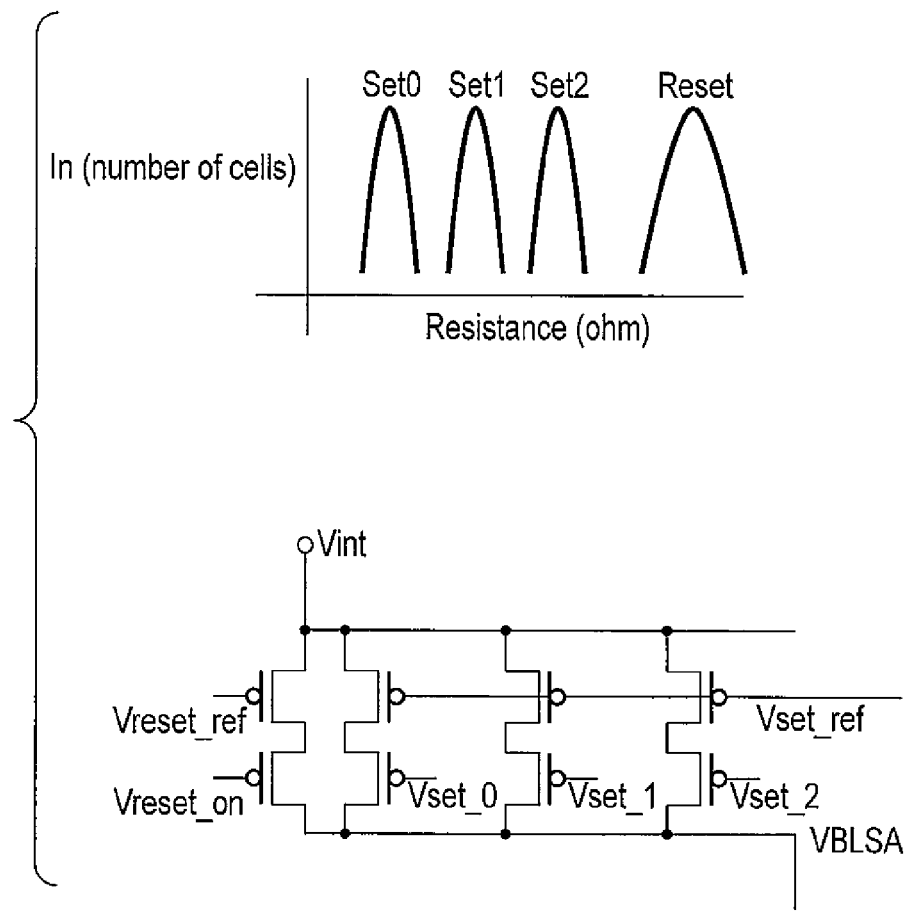
F I G. 13

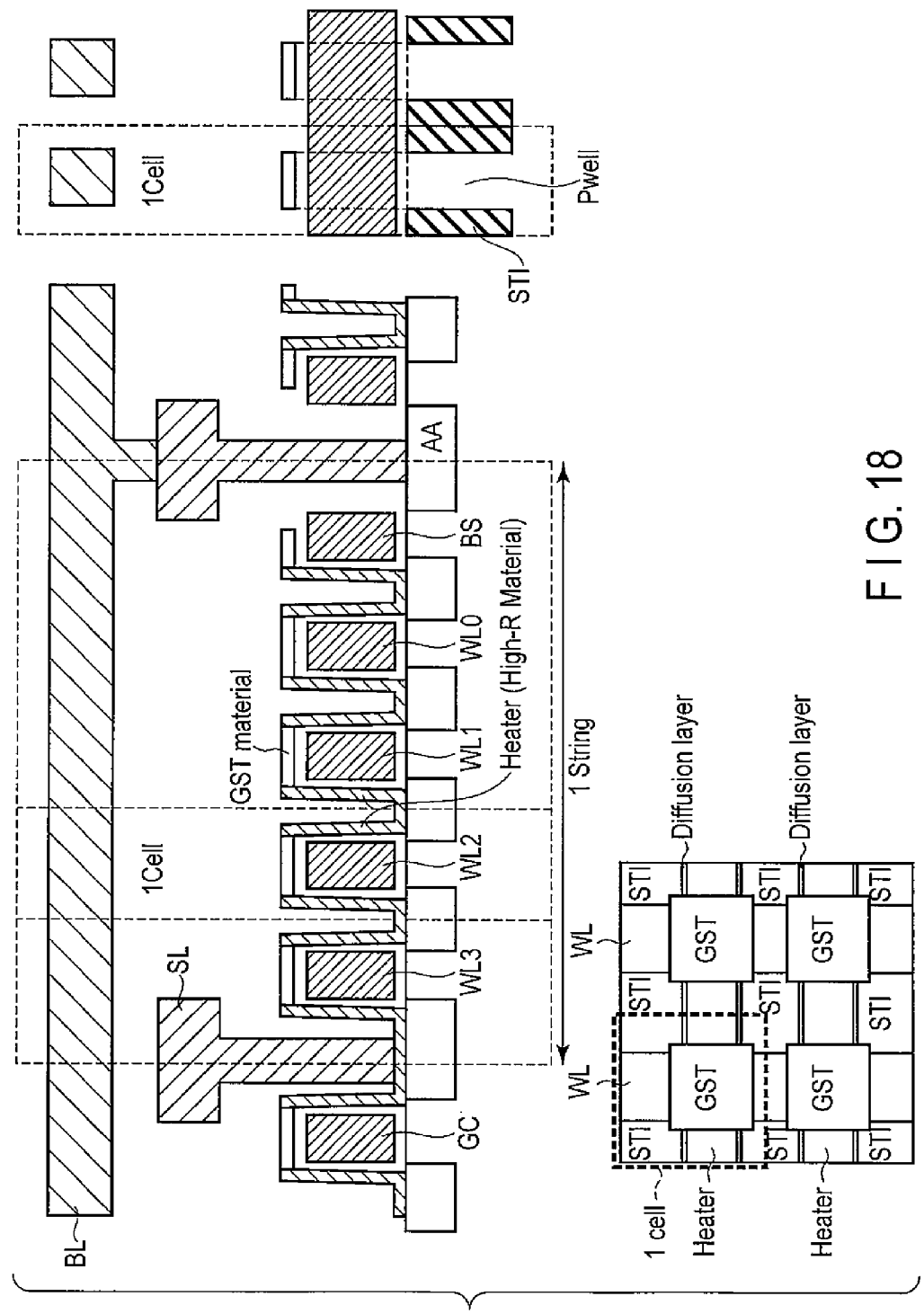
F I G. 18

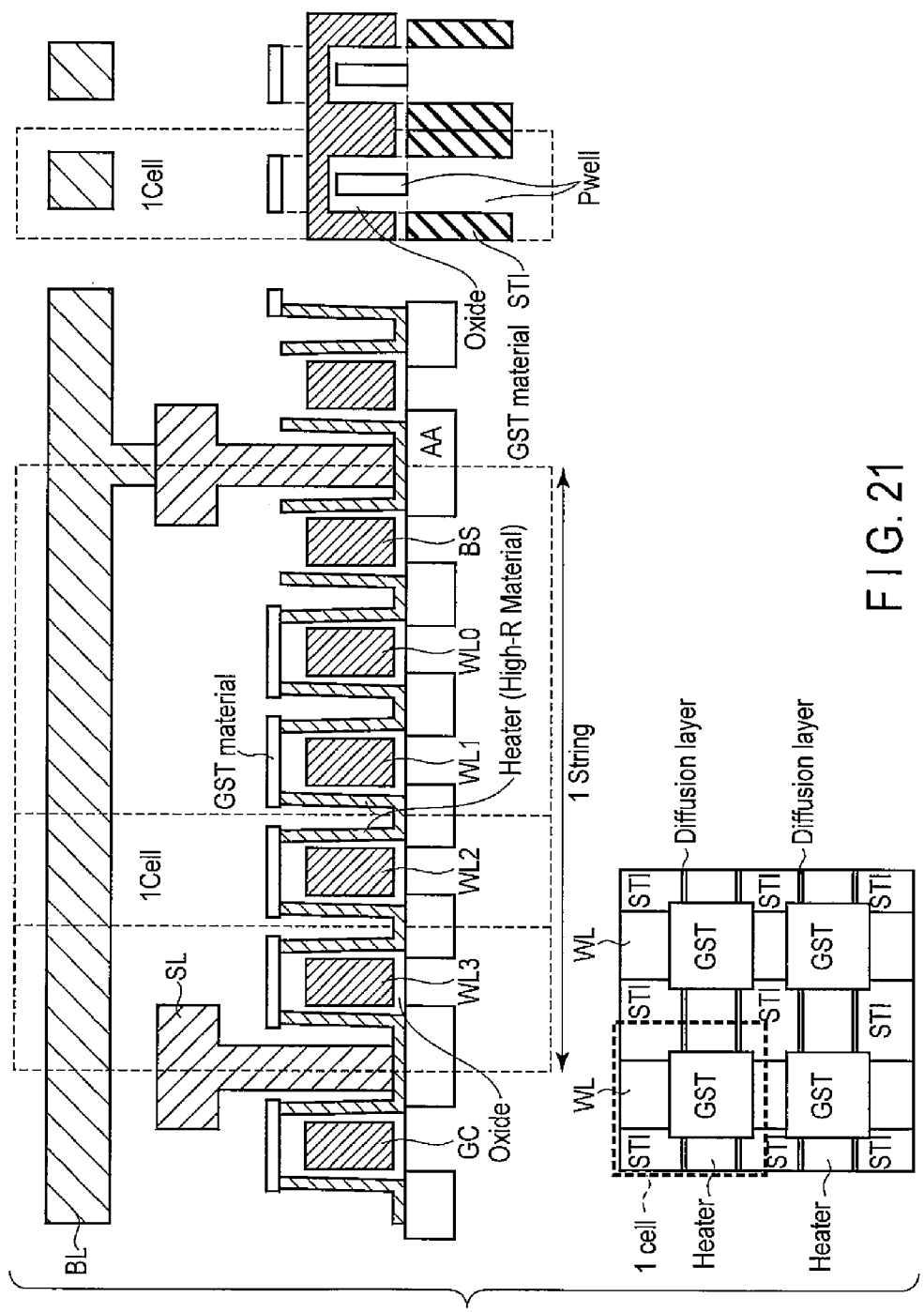
F I G. 21

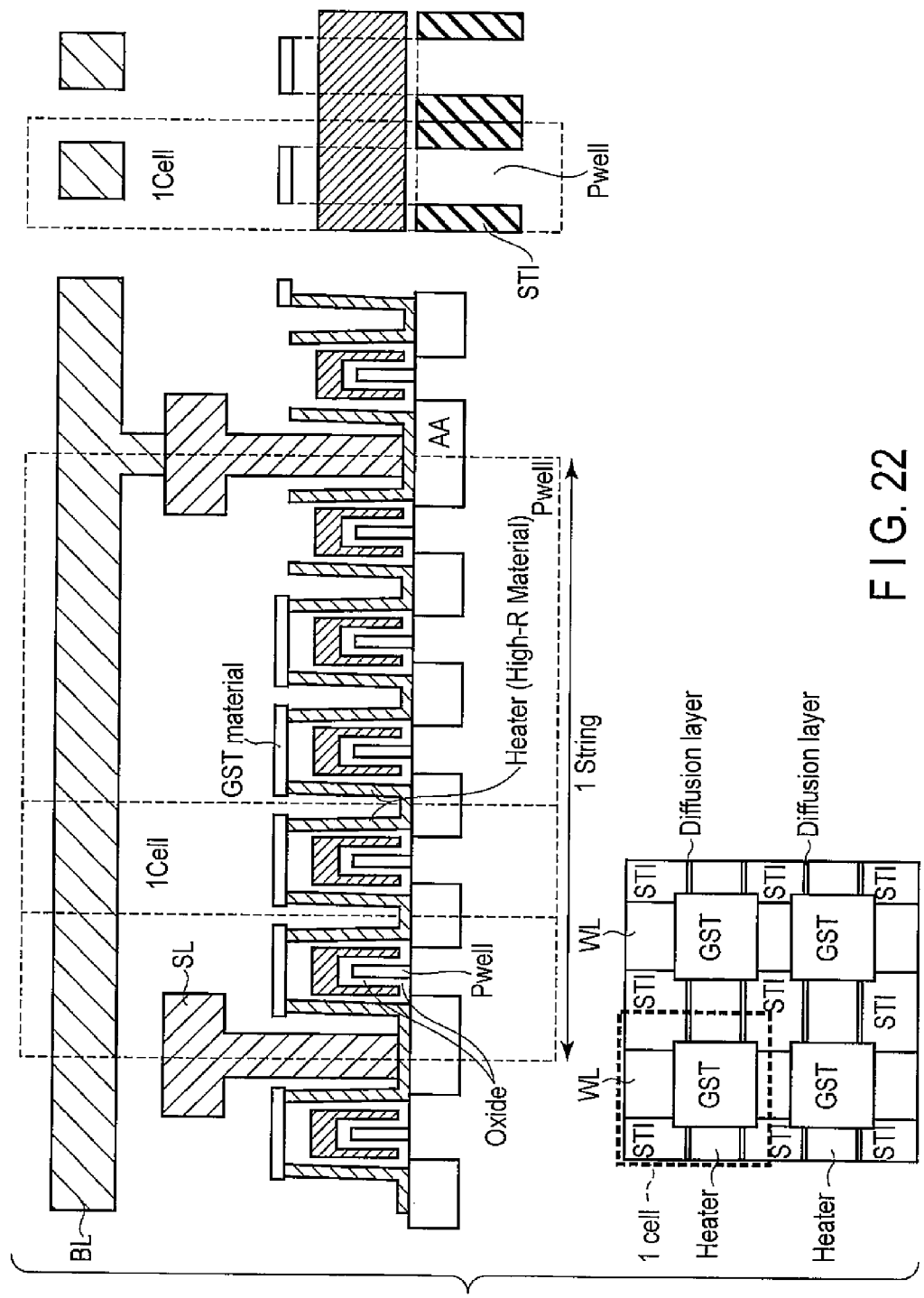
F I G. 22

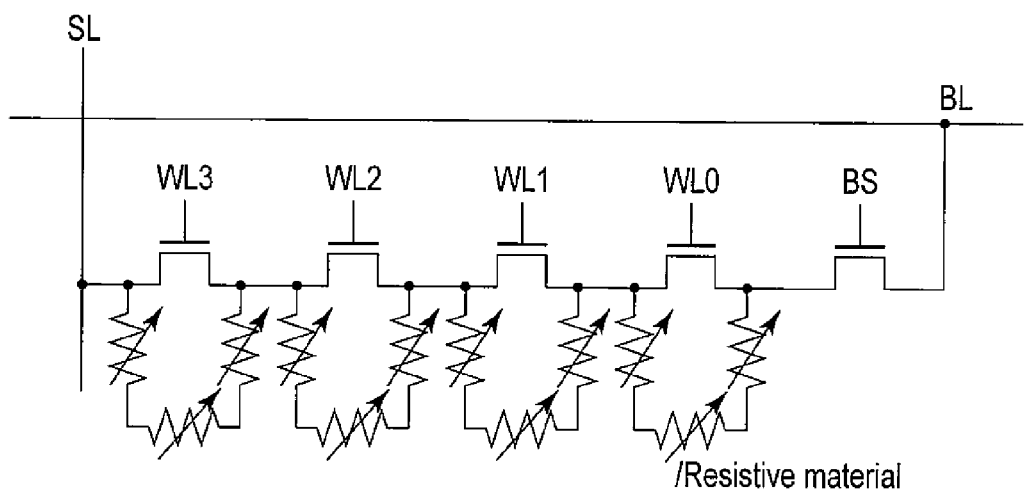
F I G. 24

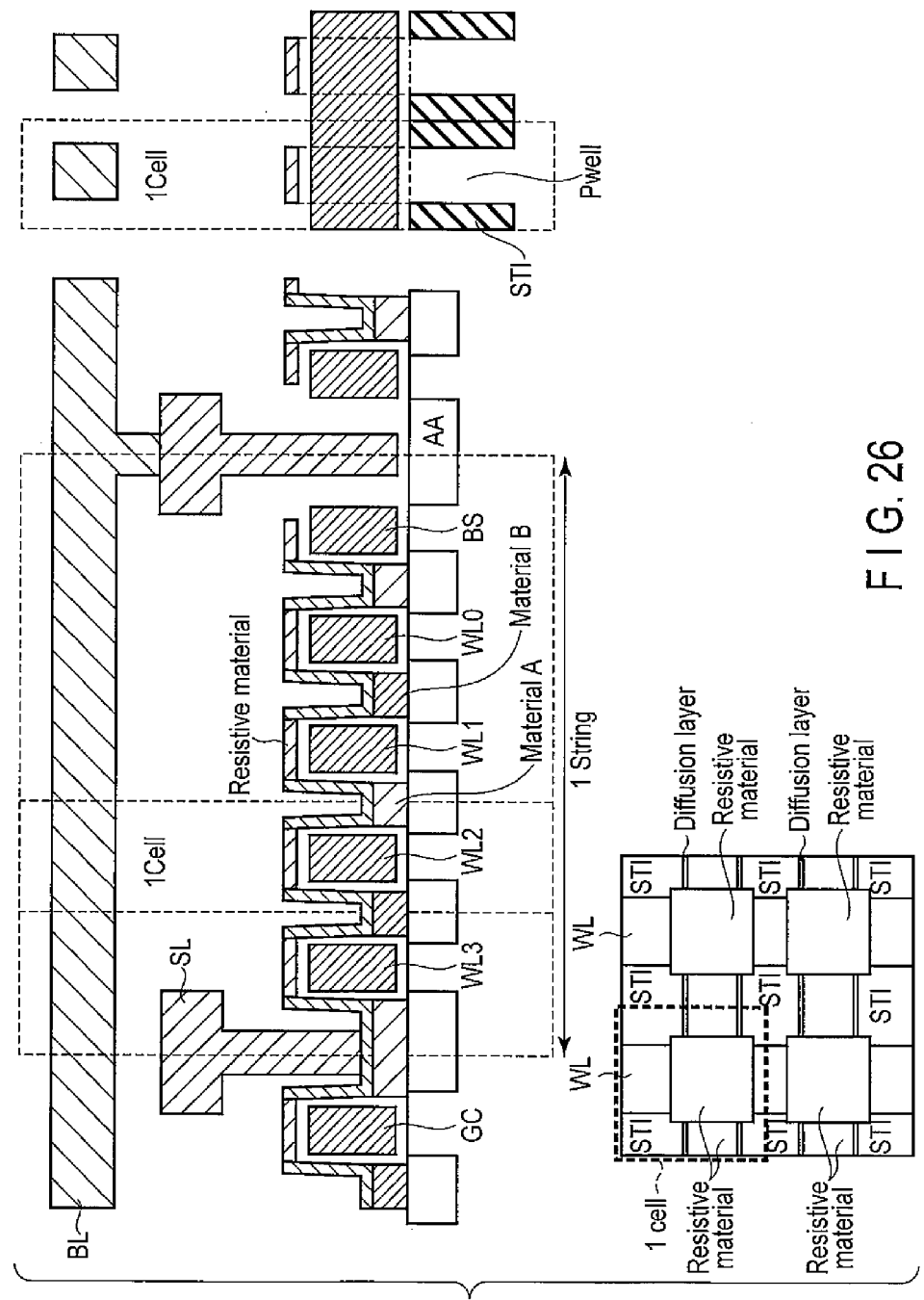
F I G. 26

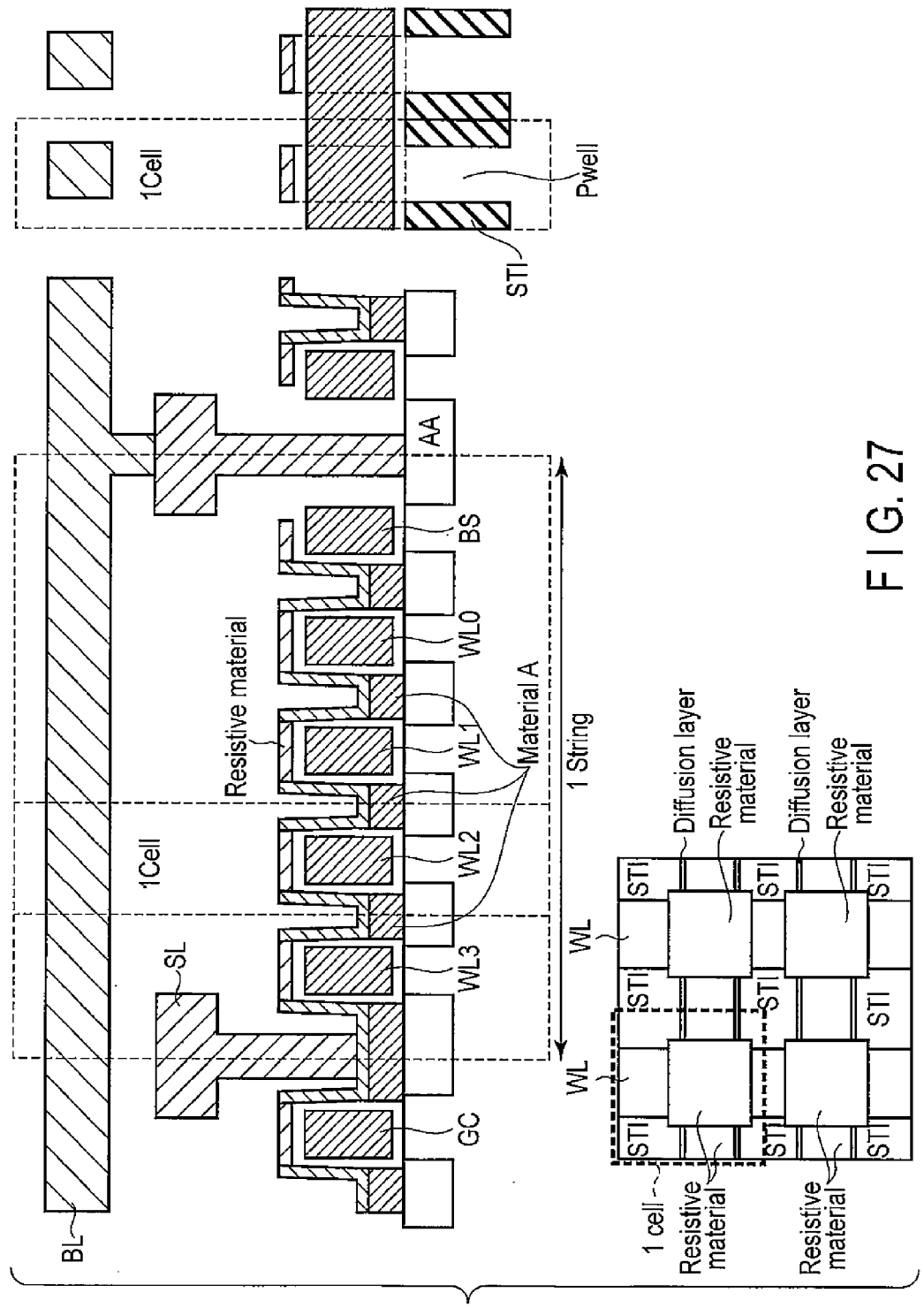
F I G. 27

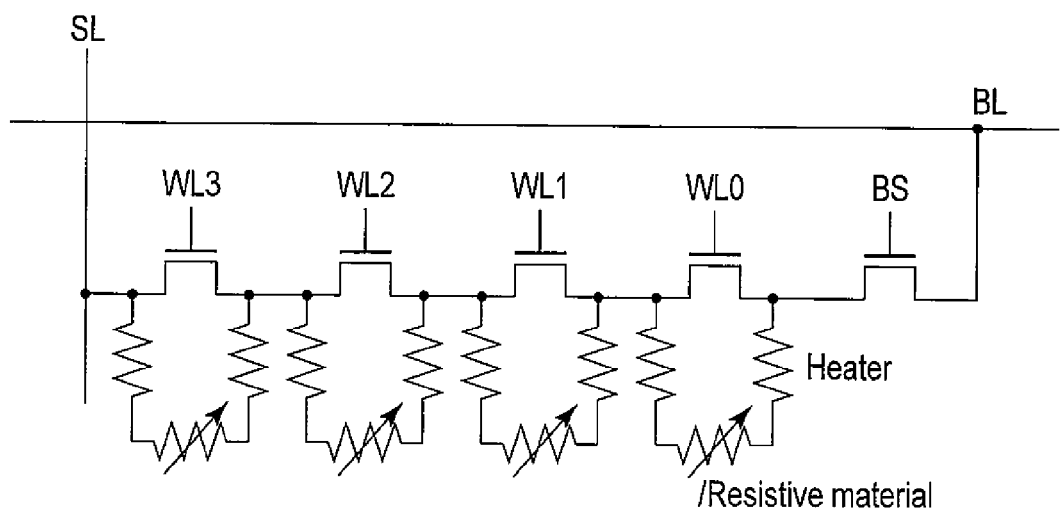
F I G. 32

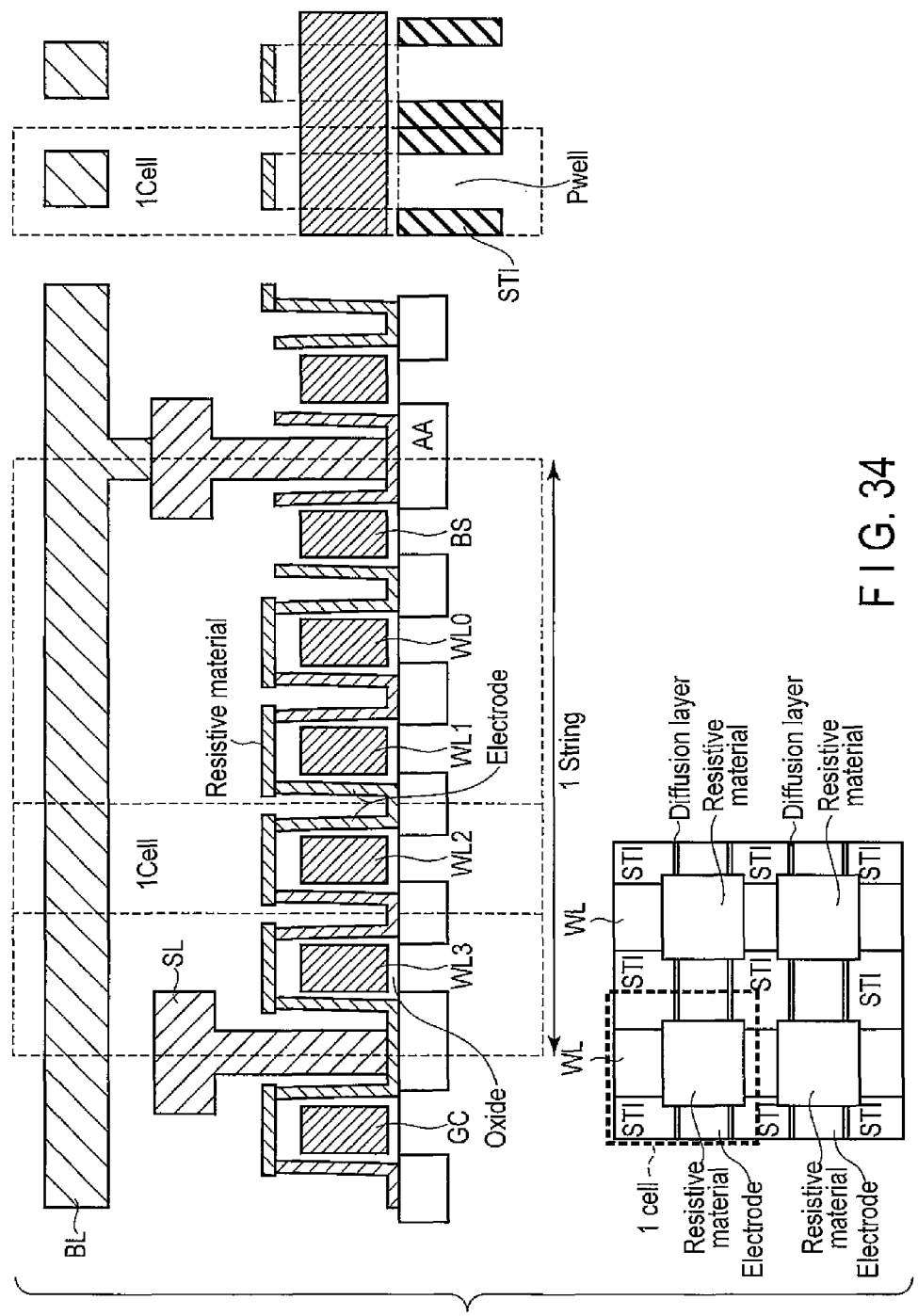
F I G. 34

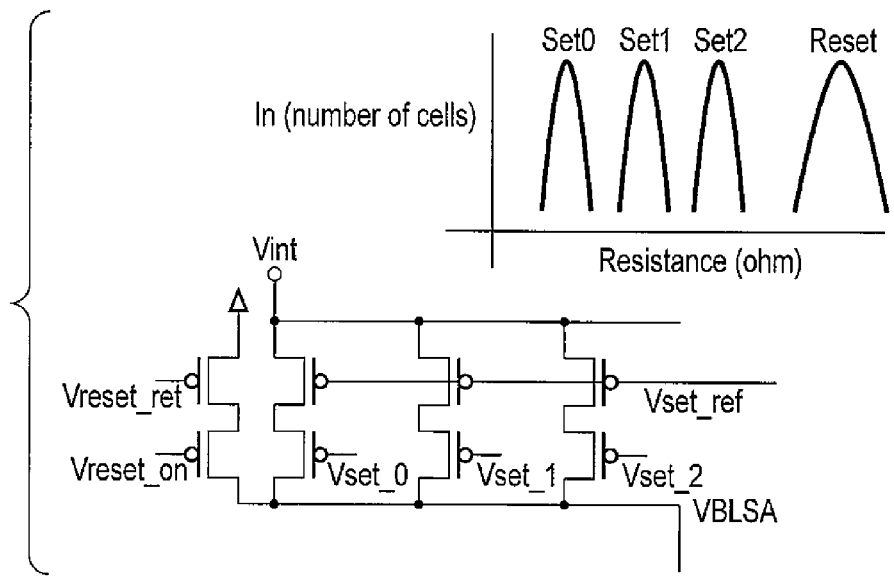
F I G. 35
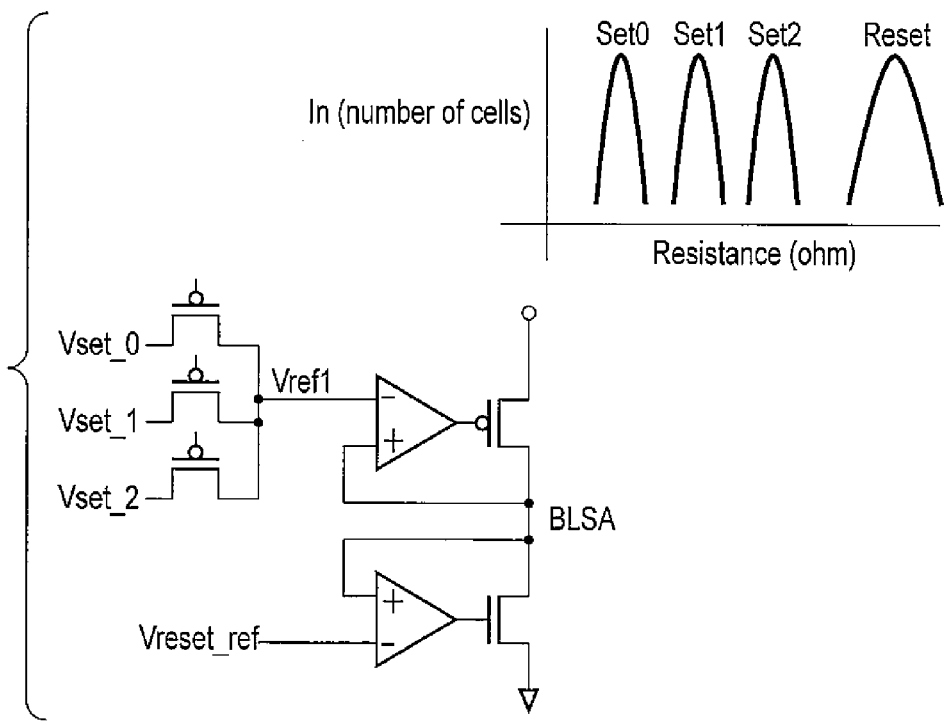
F I G. 36

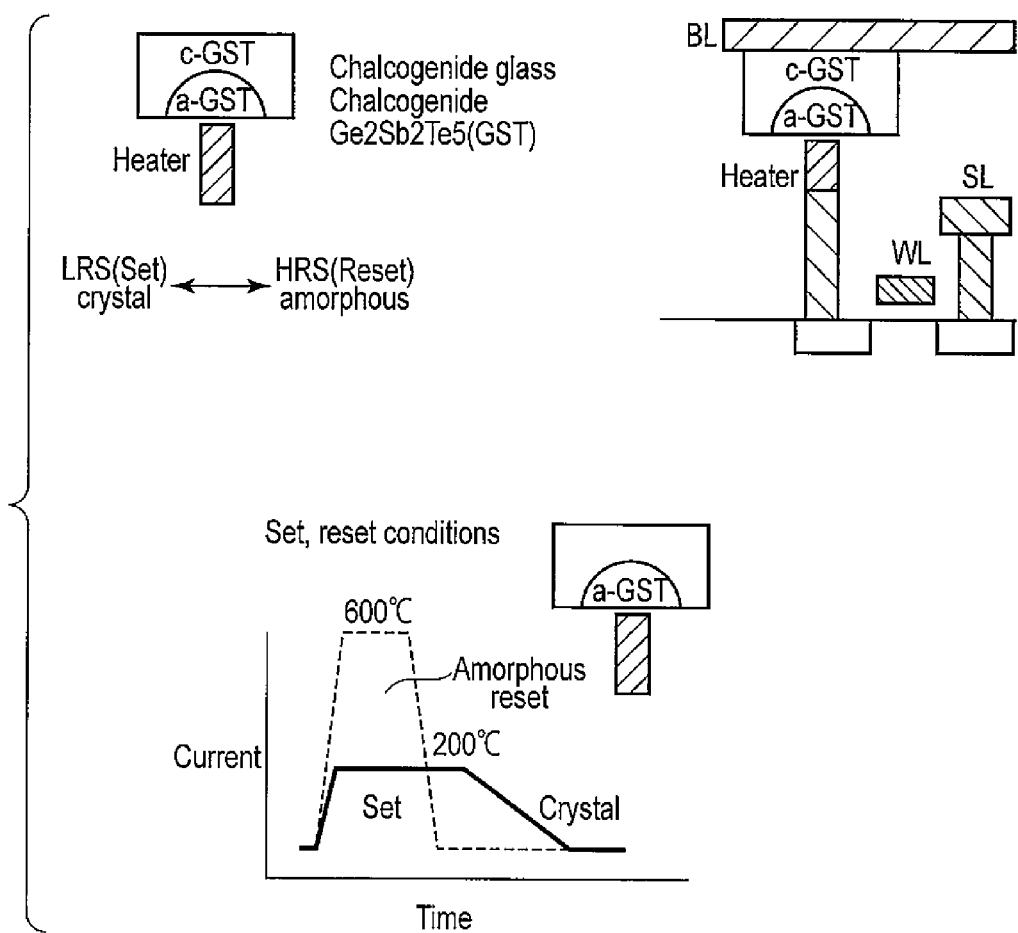
F I G. 37

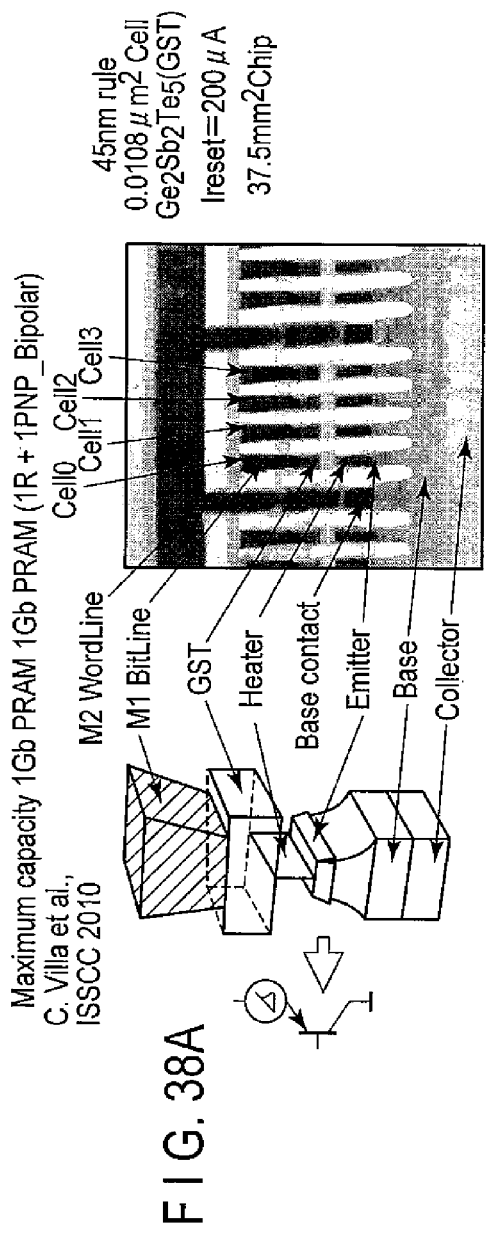
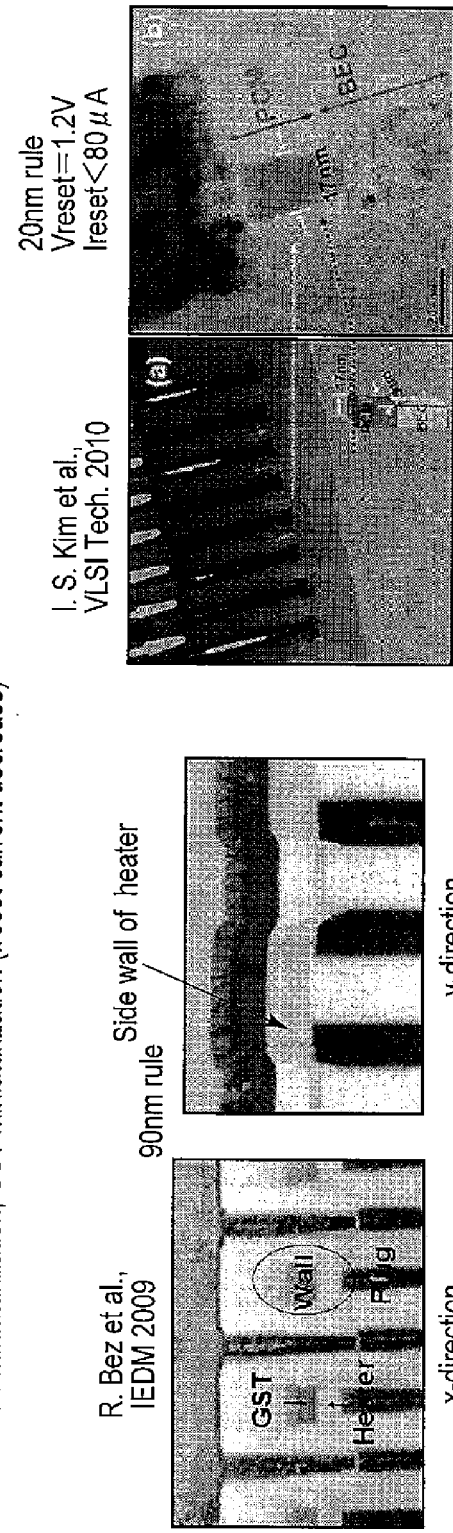
FIG. 38A
FIG. 38B
FIG. 38C

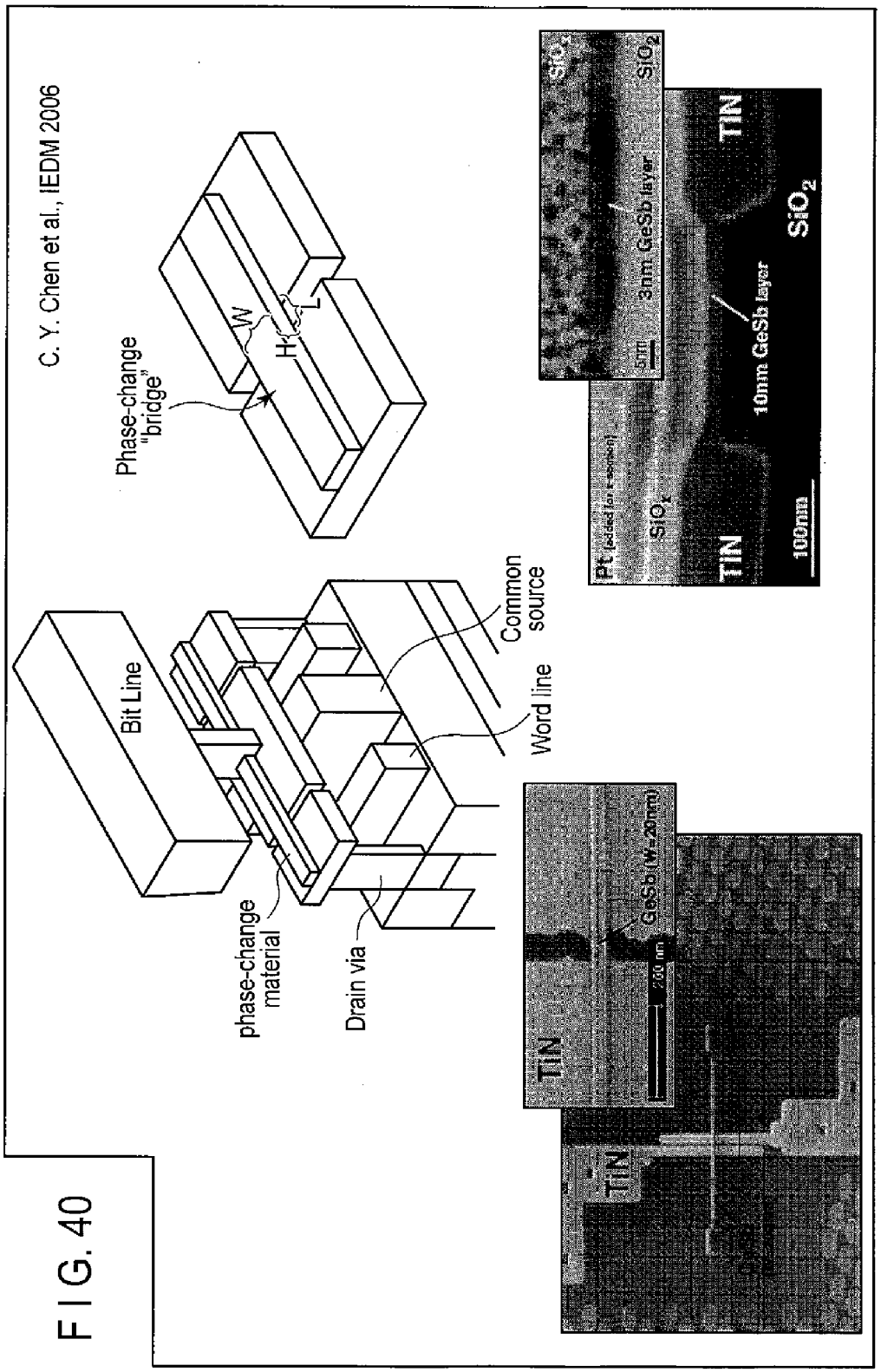
F I G. 40

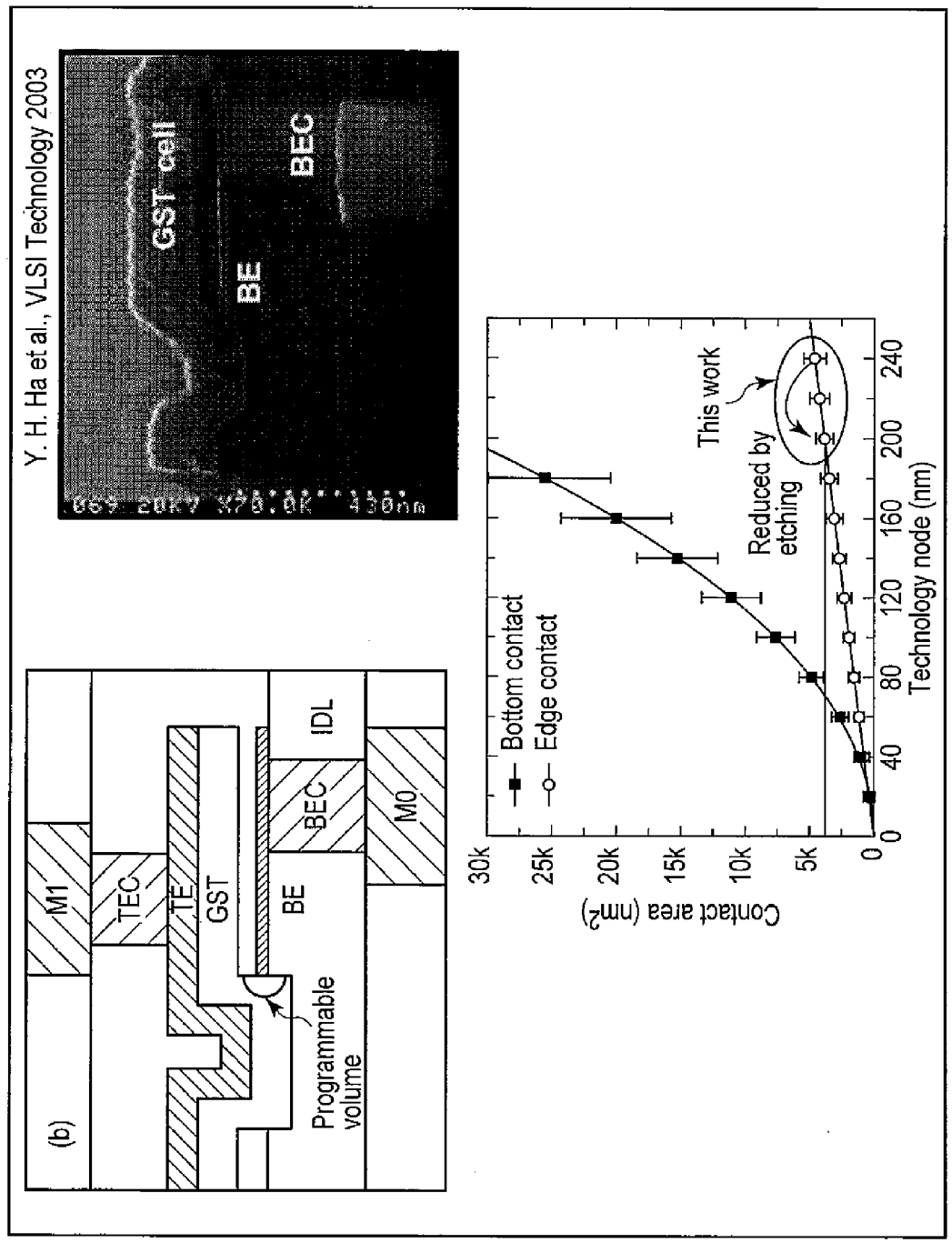
F I G. 41

RESISTANCE CHANGE NONVOLATILE SEMICONDUCTOR MEMORY DEVICE

CROSS-REFERENCE TO RELATED APPLICATIONS

This application is based upon and claims the benefit of priority from prior Japanese Patent Application No. 2011-064931, filed Mar. 23, 2011, the entire contents of which are incorporated herein by reference.

FIELD

Embodiments described herein relate generally to a nonvolatile semiconductor memory device. In a phase change memory (phase change RAM, PRAM, PCM) and a resistance change memory (resistive RAM, RRAM, ReRAM), it becomes possible to significantly decrease a write current (set current, reset current) and a read current of a phase change material wiring and a resistance change material wiring and to miniaturize the same, and further it becomes possible to reduce a memory cell size.

BACKGROUND

These days, a semiconductor memory is widely used in a main memory of a large-scale computer, a personal computer PC, home electric appliances, portable phone and the like. As a type of the semiconductor memory, volatile dynamic RAM (DRAM) and static RAM (SRAM), nonvolatile maskROM (MROM) and flash EEPROMs such as a NAND flash and a NOR flash are commercially available. Although the DRAM is the volatile memory, this is excellent in a low cost (cell area is smaller than one-quarter of that of SRAM), high speed (faster than flash EEPROM), so that this has a large share in a personal computer (PC) market and a portable phone market.

On the other hand, a rewritable nonvolatile flash EEPROM, which protects data during power off, begins to have an enormous market share in a field of the portable phone, various cards, SSD and the like recently. However, the number of rewriting (W/E number) thereof is only 10 cubic to 10 to the power of 6, write time of microsecond or millisecond is required, and a high voltage of 12 to 22 V is required, so that this has a problem in miniaturization and function.

On the other hand, as an emerging memory, a ferroelectric memory (FeRAM), a magnetoresistance memory (MRAM), the phase change memory (PRAM), the resistance change memory (RRAM) and the like have been lively developed recently. Out of them, the magnetoresistance memory (MRAM), the phase change memory (PRAM), and the resistance change memory (RRAM) store information by changing resistance of an information memory element of a memory cell.

The magnetoresistance memory (MRAM) has a small resistance change ratio of 200% and this has a problem of a demagnetizing field, so that scaling is difficult; however, the phase change memory (PRAM) and the resistance change memory (RRAM) might replace the NOR flash and the NAND flash because a resistance value thereof changes by two digits to five digits and it is possible to realize a multilevel, and because the write current and the read current may be decreased by reduction in a memory element size and this is suitable for high integration.

BRIEF DESCRIPTION OF THE DRAWINGS

FIG. 1 illustrates a circuit diagram of a memory cell string according to a first embodiment;

FIG. 3 illustrates a read operation example of the memory cell string according to the first embodiment;

FIG. 4 illustrates a set/reset operation example of the memory cell string according to the first embodiment;

FIGS. 8A and 8B illustrate heat temperature profiles of a phase change resistance element of a conventional example (A) and of this embodiment (B) according to the first embodiment;

FIG. 11 illustrates a memory cell array diagram according to the first embodiment;

FIGS. 12A and 12B illustrate sense amplifier circuits according to the first embodiment;

FIG. 13 and FIG. 14 illustrate a bit line current driver according to the first embodiment;

FIG. 17-FIG. 27 illustrate a structure diagram of a memory cell string according to a third embodiment;

FIG. 32 illustrates a circuit diagram of a memory cell string according to an eleventh embodiment;

FIG. 34 illustrates a structure diagram of the memory cell string according to the eleventh embodiment;

FIG. 35 illustrates a bit line current driver according to the eleventh embodiment;

FIG. 36 illustrates a bit line voltage driver according to the eleventh embodiment;

FIG. 37 illustrates a phase change memory structure and an operation example according to a comparative example;

FIGS. 38A, 38B and 38C illustrate a miniaturization example of a GST film and a heater element of the phase change memory according to the comparative example;

FIG. 40 illustrates a structure example of the GST film through which a current in a lateral direction flows of the phase change memory according to the comparative example; and FIG. 41 illustrates a structure example of the heater element through which the current in the lateral direction flows of the phase change memory according to the comparative example.

DETAILED DESCRIPTION

Figure 2:
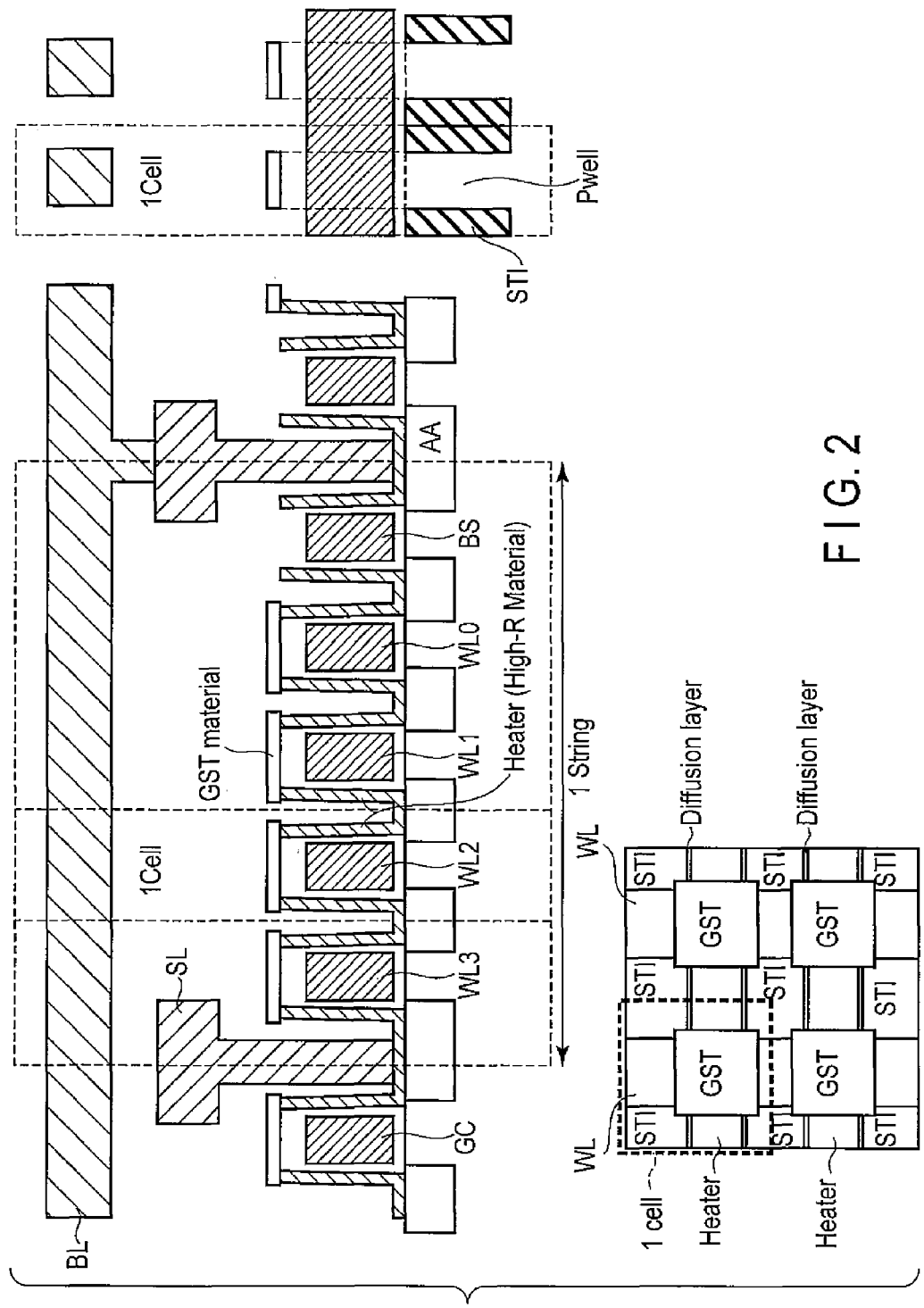
FIG. 2 illustrates a structure diagram of the memory cell string according to the first embodiment.

In general, according to one embodiment, an phase change memory includes a memory cell, a block select transistor, and a memory cell array. The memory cell includes a chalcogenide wiring, resistance wirings, and a cell transistor. The resistance wirings becomes a heater. Each of one end of the resistance wirings is connected to each of both ends of the chalcogenide wiring. Each of the other ends of resistance wirings are connected a source and a drain of the cell transistor. One end of a plurality of memory cells with sources and drains connected in series is connected to a source of the block select transistor. A bit line is connected a drain of the cell transistor. The memory cell array is obtained by forming a memory cell string by connecting the other end of the memory cells connected in series to a source line, connecting a gate of the memory cell to a word line, and connecting a gate of the block select transistor to a block select line, and by arranging a plurality of memory cell strings.

First, a comparative example corresponding to this embodiment is described with reference to FIGS. 37 to 41. FIG. 37 illustrates a cell configuration of a PRAM according to the comparative example. A mechanism is such that, when a cell transistor is turned on to apply a current between a bit line BL and a source line SL, a heater, which is a high resistance element, generates heat and melts chalcogenide glass (GST: Ge2Sb2Te5), which is in contact with the heater, thereby causing transition of a state. By melting at a high temperature (high current) and cooling at high speed (stopping current), an amorphous state is obtained (reset operation), and by melting at a relatively low high temperature (low current) and cooling at low speed (gradually decreasing current), a crystal state is obtained (set operation). Accordingly, at read time, "0" and "1" information is judged depending on whether the current flowing between the bit line BL and the source line SL is large (low resistance=crystal state) or small (high resistance=amorphous state).

In this case, a reset current is significantly large such as 200 uA, for example. In order to apply such large reset current to the cell transistor, a memory cell size significantly increases. In order to apply the large current, a select element such as a bipolar transistor and a diode may be used as illustrated in FIG. 38A. When the reset current is large, since an IR-drop voltage by resistances of the bit line and the source line is large, it is not possible to increase a memory cell array size, and since the number of bits read and written at one time is limited by limitation of a total current of a chip, a read/write bandwidth disadvantageously decreases. In order to solve this problem, there is a method of forming the heater element on a side wall as illustrated in FIG. 38B. Accordingly, heat density of the heater element increases, and the high temperature and the low current are easily realized.

However, although the heater may be formed on the side wall by sputtering and the like and is easily formed into a thin film, since a GST film, which is a phase change element formed by CVD and the like, is in contact with the same, this is spread in a hemispherical shape as in FIG. 37 and heat conduction is spread in a three-dimensional manner, so that it is difficult to realize the high temperature and the reset current might increase.

In order to solve this problem, there is a method of embedding both of the heater element and the GST element in a minute contact by the CVD as illustrated in FIG. 38C. However, since a contact size is determined according to a design rule, there is limitation in decreasing cross sections of the heater and the GST film and generating the high temperature at the low current. There also is a problem of limitation in embedding the GST film in the small contact by the CVD. Also, even when the cross section of the heater is decreased, the reset current of the GST is not decreased in proportion to the cross section.

Figure 39:
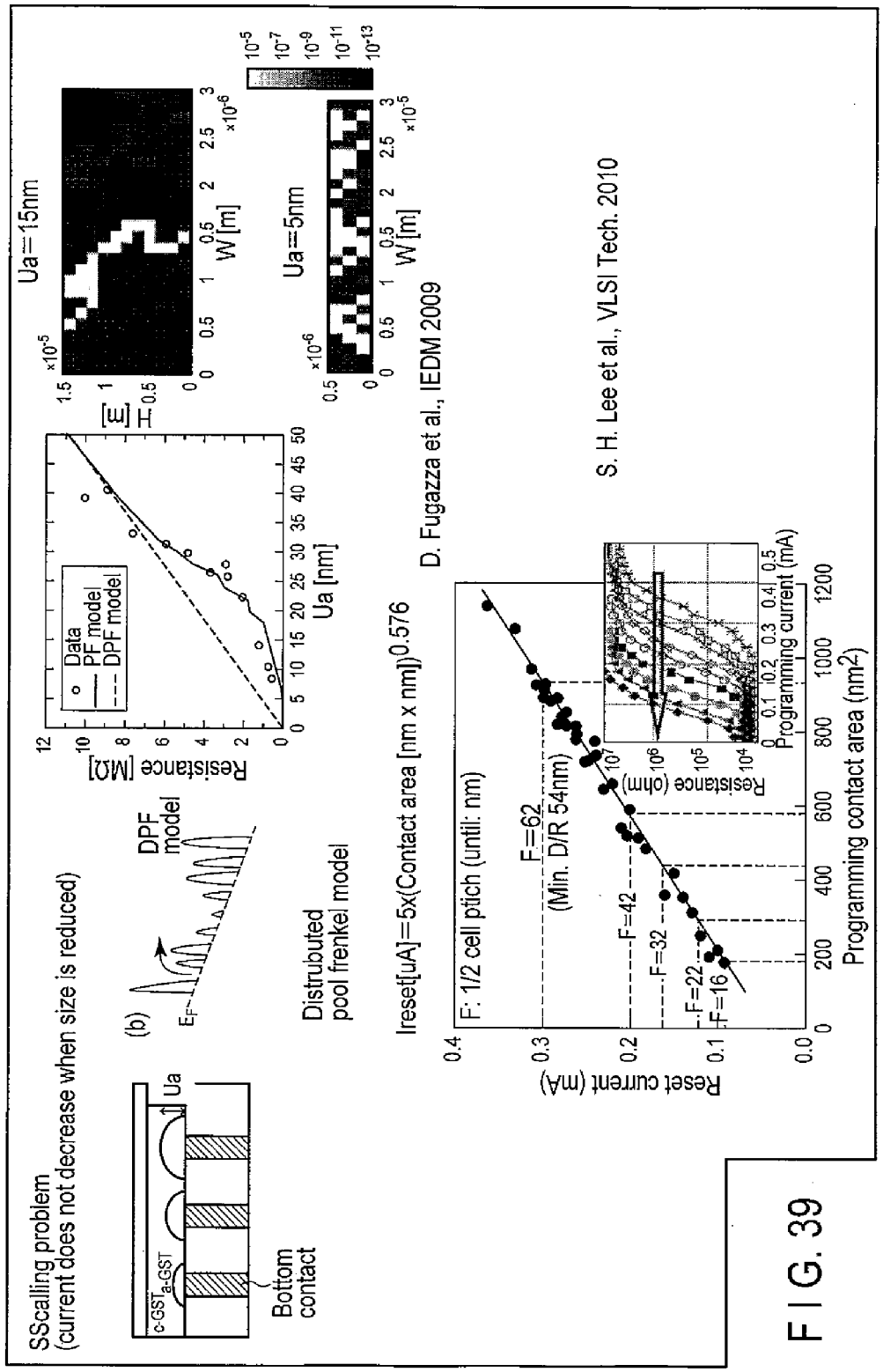
FIG. 39 illustrates a current model in miniaturization of the phase change memory according to the comparative example.

As illustrated in an improved model by Poole-Frenkel in FIG. 39, when the heater is miniaturized, a size of the hemisphere of the GST decreases; however, a thickness of the GST in a direction in which the current flows also decreases, so that the number of hopping paths increases and a write current and a read current increase by this effect, therefore the current decreases only a little. Accordingly, a reset current Ireset is experimentally in proportion to 10 to the power of 0.576 of the cross section of the heater. Therefore, it is not possible to realize a low reset current unless the cross section is extraordinarily decreased.

As a method of solving this problem, there is a method of forming the GST film into the thin film and forming heater elements TiN on right and left sides thereof as illustrated in FIG. 40. Accordingly, it is possible to easily increase the resistance of the GST only by forming the thin film. However, since it is structurally required to form the GST film on the heater element of TiN and it is required to form a source/drain contact of the transistor just under the contact from the bit line to a GST/TiN film and the GST/TiN film, so that it is difficult to make the GST/TiN film thin and there is a possibility that the heat density of the heater does not eventually increase. Further, as a structure of a memory cell, when a wiring width and space are set to F, a 6F2 (3F×2F) memory cell is obtained in principle; however, an alignment margin of the contact from the bit line with the GST/TiN and an area of the connection contact between the TiN films and the source/drain are required, and if a distance between the contact and a gate of F is required, a large 2F×4F=8F2 cell is obtained. Further, since it is not possible to make the heater thin, it is not possible to decrease the cell reset current and the large reset current is required, so that a problem that the cell size is determined according to the cell transistor to which the reset current is applied occurs.

FIG. 41 illustrates an example in which the heater element is arranged in a lateral direction. Since the current flows through the heater in the lateral direction, this may be formed into the thin film; however, the transition between the crystal state and the amorphous state occurs in the hemispherical portion of the GST film, this eventually has the same effect as that in FIG. 38B and the reset current is large. Further, it is required to arrange also a top electrode (TE) in the lateral direction, the cell size considerably increases. It goes without saying that the same thing occurs when the structure is applied to a RRAM, and a problem of the large reset current might occur also in the RRAM in the comparative example.

As described above, in the PRAM (RRAM) in the comparative example, it is not possible to decrease the cross sections of the GST film and the heater element in the direction in which the current flows, so that a set current, the reset current, and a read current increase and scaling is problematically difficult. This embodiment is hereinafter described with reference to the drawings.

First Embodiment

Hereinafter, a first embodiment is described with reference to the drawings. FIG. 1 illustrates a circuit diagram of a memory cell string according to the first embodiment.

Illustration of variable resistance represents a phase change resistance element made of chalcogenide glass (GST: Ge2Sb2Te5), resistance elements, which become heaters to generate heat when a current is applied thereto, are formed on both sides of the phase change resistance element, and both ends of the resistance element are connected to a source and a drain of a cell transistor to compose one memory cell. A gate is connected to a word line WLi. A plurality of memory cells are connected in series, and one end thereof is connected to a bit line BL through a block select transistor and the other end thereof is connected to a source line SL. A gate of the block select transistor is connected to a block select line. Although 4 cells are connected in series in this example, the number of cells may be 1, 2, 8, 16, 32, 64, 128, 256 and the like. The GST is required to include at least two atoms out of Ge, Sb, and Te. Further, nitride (N) and another impurity dope may also be included.

FIG. 2 illustrates a structure diagram of the memory cell string according to the first embodiment. The heater element is deposited into a thin film on a side wall of a gate electrode wiring (WLi) of the cell transistor, which is the word line, and a diffusion layer (AA) portion of the source and the drain of the cell transistor. A high-resistance material such as TiN and W is deposited and an STI portion in a word line direction is fabricated to be removed by lithography. Thereafter, an insulating film is embedded between the word lines. Thereafter, the heater element on the insulating film of the gate and the insulating film thereon are removed by CMP, anisotropic etching and the like, and the heater element is exposed on a side wall end. Thereafter, the chalcogenide glass is deposited into the thin film by CVD, MOCVD, sputtering and the like in a flat state. Thereafter, the chalcogenide on a portion other than the memory cell portion is removed by lithography fabrication. Thereafter, a contact is formed of W and the like and a connection pad of the source line and the bit line is formed of a metal wiring such as W. Thereafter, after the contact is formed, the bit line is formed of a M1 wiring and the like of Cu/Al and the like. Wirings M2, M3 and the like thereon are optional.

In order to achieve a melting point by a sufficiently low current, a thickness of the chalcogenide and a thickness of W are desirably set to smaller than 3 nm. As illustrated in a lower part of FIG. 2, an actual memory cell size is 2F obtained by an AA width and an STI width in the word line direction and 2F determined by a pitch of a gate (GC) in a bit line direction, so that a 4F2 memory cell may be easily realized. Since a heater layer is thin, this may be realized.

FIGS. 3 to 7 illustrate operation examples of the memory cell string according to the first embodiment. FIG. 3 illustrates a read operation example of a PRAM of the first embodiment. At a stand-by time, there is not a problem if a block select line BS is set to LOW. Any state is possible in a shaded area. All the word lines may be set to HIGH or LOW. It is more preferable that they are set to HIGH because all the cell transistors may be turned on; however, there is not a problem also when they are set to LOW. When the word line WLi is set to HIGH, it is desirable that the bit line BL and the source line SL are set to a voltage VINT1 slightly higher than VSS although it is optional. This is because a stress applied to the cell transistor may be relaxed.

At read operation time, a word line WL2 of a selected cell is set to LOW, other word lines WL0, 1, and 3 are maintained at HIGH, the voltage of the source line SL is decreased to VSS, and the block select line BS is set to HIGH. Then, since the cell transistor of a non-selected cell of a selected cell string is turned on, only a slight voltage is applied to the GST film and the heater resistance element of the non-selected cell, a large part of the voltage is applied to the GST film and the heater resistance element of the selected cell of which cell transistor is turned off, so that the current is applied to them.

If the GST film at that time is in an amorphous state of which resistance is high, only a small current flows from the bit line BL and the bit line BL is maintained at a HIGH state, and if the GST film is in a crystal state of which resistance is low, a large current flows from the bit line BL and the bit line BL is put into a LOW state. This difference is amplified by a sense amplifier circuit connected to an end of the bit line and it is judged whether the data is "1" data or "0" data.

In general, the phase change element also has approximately two-digit resistance difference, so that it is possible to sufficiently read written "1" information and "0" information. At that time, potential difference between the bit line BL and the source line SL is suppressed to a low voltage such that the information is not changed by the heat of the heater. This is because the heat is in proportion to I×R×R. Another feature of the memory is that cell data is not read even when the block select line BS is selected unless the voltage is applied between the bit line BL and the source line SL.

As one method, the word line WL, the source line SL, and the block select line BS are set to LOW at the stand-by time, then, if the block select line BS is set to HIGH while the source line SL is maintained at LOW and only a selected bit line BL is set to HIGH at the operation time, the current does not flow to a non-selected bit line BL, so that it's OK.

As another example, the word line WL, the source line SL, and the block select line BS are set to HIGH, VINT1, and LOW, respectively, at the stand-by time, then the non-selected bit line BL, a selected block select line BS, and a selected source line SL are set to LOW, HIGH, and LOW, respectively, at the operation time, only the cell of a selected word line and the selected bit line BL is read.

FIG. 4 is a write operation example of the PRAM of this embodiment. At the stand-by time, various states are allowed as at the read time. At the operation time, only the word line of the selected cell is set to LOW, the selected source line SL is set to LOW, the selected block select line BS is set to HIGH, and a non-program bit line is maintained at LOW, then, out of the selected bit line BL, for the cell of which GST film is wanted to be put into the amorphous state to increase the resistance thereof (reset), the voltage of the bit line BL is set to the highest voltage VINT3 for a short period of approximately 100 ns. Accordingly, the large current flows only to the GST film and the heaters on both ends of the selected cell, the GST film is melted by Joule heat of the heater, thereafter, the bit line BL is suddenly set to LOW to rapidly cool the GST film and put the same into the amorphous state, and high resistance operation thereof (reset) is performed.

Out of the selected bit line BL, for the cell of which GST film is wanted to be crystallized to decrease the resistance thereof (set), a lower voltage of VINT2 is applied to the bit line BL for a longer period of approximately hundreds of ns. Accordingly, the small current flows to the GST film and the heaters on the both ends of the selected cell, the GST film is melted by the Joule heat of the heater, and thereafter the bit line BL is slowly set to LOW to change the GST into the crystal state, and the low resistance (reset) operation thereof is performed.

Figure 5:
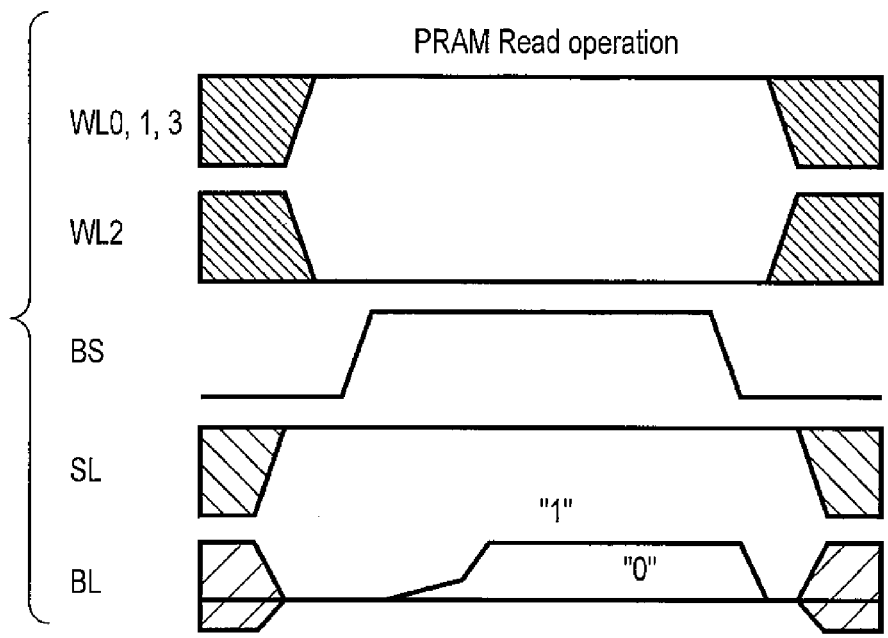
FIG. 5 illustrates the read operation example of the memory cell string according to the first embodiment.
Figure 6:
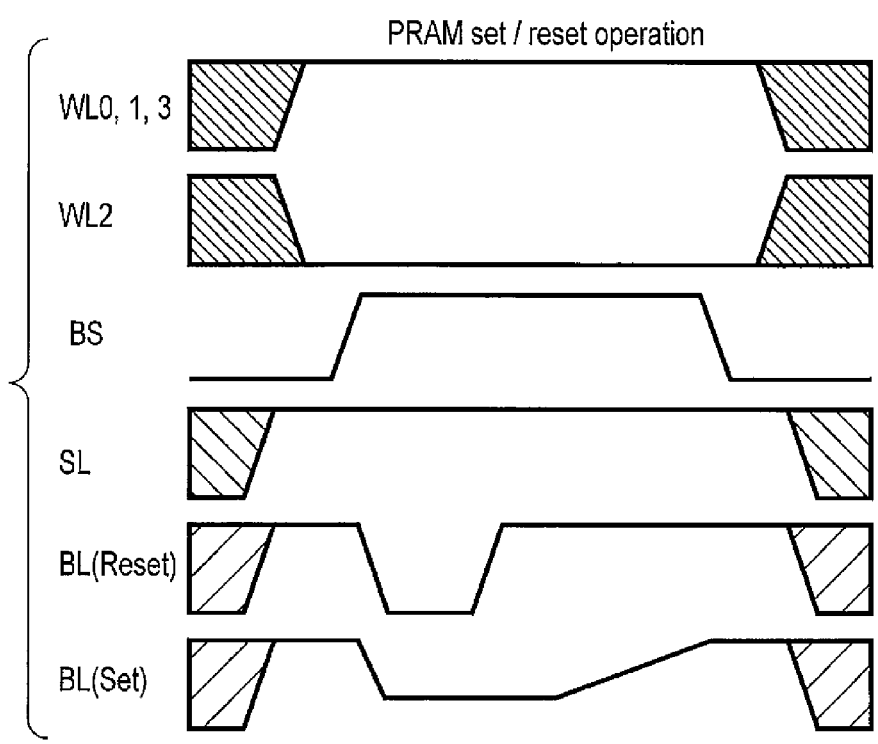
FIG. 6 illustrates the set/reset operation example of the memory cell string according to the first embodiment.

FIGS. 5 and 6 illustrate other read/write operation examples. The drawings are different from FIGS. 3 and 4 in that the source line SL is set to VINT and only the selected bit line BL is set to VINT4 lower than VINT to apply the current for reading at the read operation time, and that the source line SL is set to VINT and only the selected bit line BL is set to VINT5 slightly lower than VINT to perform set operation, and set to further lower VINT6 to perform the reset operation at the program operation time.

Figure 7:
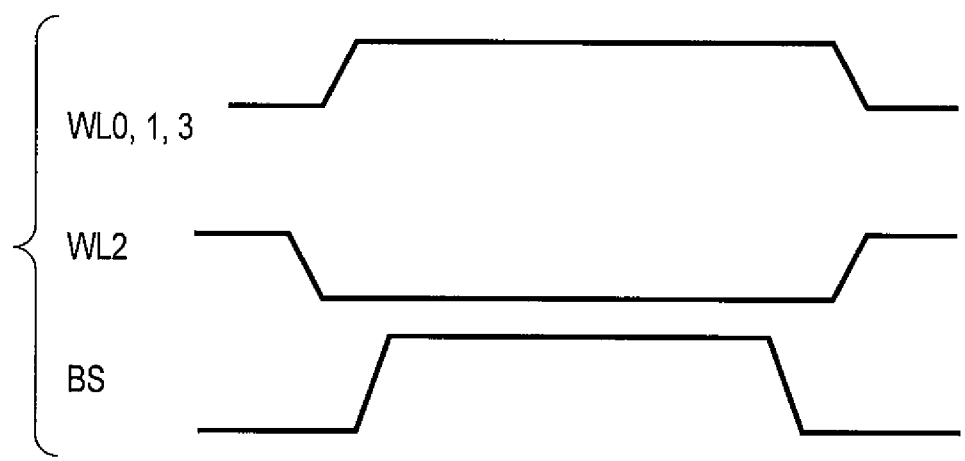
FIG. 7 illustrates an operation example of word line driving of the memory cell string according to the first embodiment.

FIG. 7 illustrates an example in which all the word lines WL are set to the low voltage at the stand-by time and the selected word line WL is set to VSS and the non-selected word line WL is booted to a higher voltage at active time in order to suppress an electric field to be applied to the cell transistor at the stand-by time low while turning on the cell transistor at the stand-by time.

As described above, by performing the operation in FIGS. 3 to 7 with the structure in FIGS. 1 and 2, it is possible to significantly decrease a cross section of a portion through which the current flows of the GST film only by making the GST film thin by a simple method other than side wall formation and contact embedding to decrease the read current and the write current (reset current, set current), thereby enabling driving by a minimum transistor, and further, a 4F2 minimum cell size of a wiring pitch of the gate and pitches of the diffusion layer and the STI may be realized.

Further, it is possible to easily form the heater resistance element on the side wall of the transistor into the thin film, so that heat density is improved and the current may be decreased, and since this is the thin film, it is not required to widen the gate pitch. Further, it is possible to select an optional cell of the selected cell string to realize random read/write. Also, it is possible to significantly decrease the number of contacts from the bit line BL to the cell string, a bit line capacity is small and it is possible to realize high speed and low electric consumption. Also, by increasing the number of cells of the memory cell string, it is possible to decrease a mean cell size. Also, since a heater length is long, it is possible to decrease erroneous writing by heat interference when the reset operation of an adjacent cell is performed. The heat is actually transmitted through the heater because the adjacent GST films are close to each other but heat conductivity of the insulating film is low; however, there is a distance between the GST films through the heater having a size of twice the gate height in this embodiment, so that it is possible to significantly decrease the problem of the heat interference.

Further, there is not a problem of a boundary of the amorphous state and the crystal state of the conventional hemispherical GST, the length of the phase change resistance element is limited and an entire inside is easily set to the amorphous state or the crystal state, so that this is resistant to variation.

Further, since a length direction in which the current flows is longer than a cross-sectional direction, a hopping conduction path is limited and it is possible to inhibit variation and a low-resistance effect due to miniaturization.

Further, as compared to the state of the conventional GST film in which the heater is present only on one side (FIG. 8A), in this embodiment, as illustrated in FIG. 8B, the heater elements are arranged on both sides of a phase change resistance material to heat the chalcogenide by the Joule heat of the heater elements from the both sides, so that a heat confining effect acts and a temperature of a portion of the chalcogenide at the lowest temperature may be maintained high even with smaller reset current and set current, so that it is possible to decrease the write current to approximately one-third thereof.

Figure 9B:
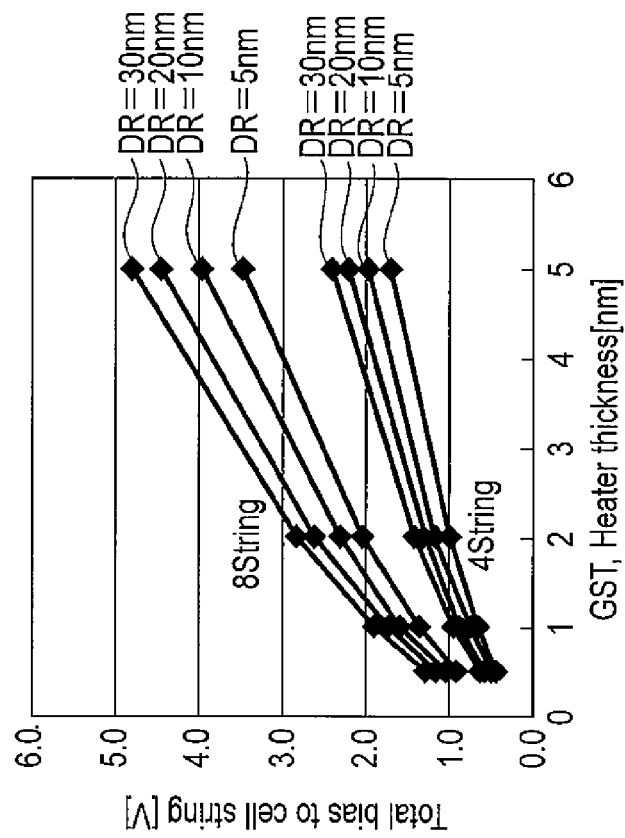
FIGS. 9A and 9B illustrate a reset current and a voltage effect in a non-selected cell according to the first embodiment.
Figure 9A:
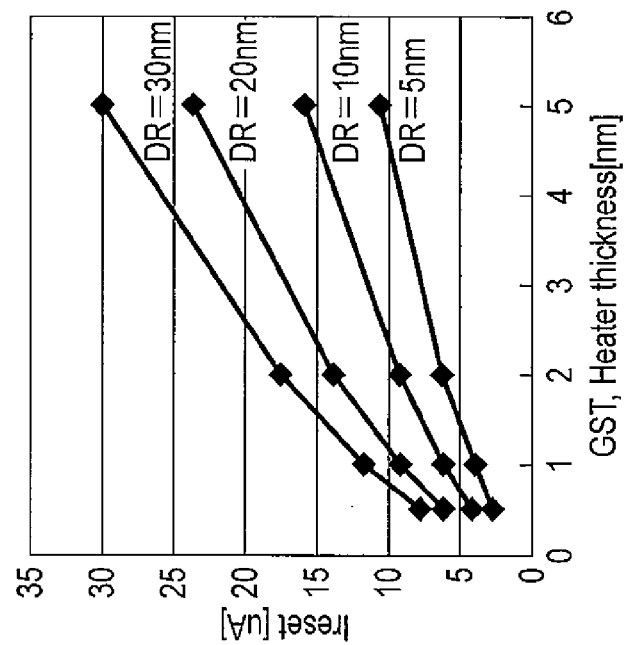

FIG. 9A illustrates experimental data in which the reset current Ireset is in proportion to 10 to the power of 0.576 of a cross section of the heater and illustrates a relationship between a film thickness of the GST film of this embodiment and the reset current when the current is further decreased to approximately one-third thereof by the heat confining effect. As a design rule (DR) of a line and a space of the gate wiring, the AA width, the STI width and the like decrease to 30 nm, 20 nm, 10 nm, and 5 nm, and as the film thickness decreases from 5 nm to smaller than 1 nm, it is possible to significantly decrease the reset current from conventional approximately 200 uA to approximately several uA.

FIG. 9B illustrates a sum of the voltages applied to the sources and the drains of a non-selected cell transistor and the block select transistor when the reset current is applied in the cases in which the memory cell string lengths are 4 and 8 in the same condition. With the memory cell string of eight cells in series when the GST film thickness is set to (smaller than) 1 nm and with the memory cell string of four cells in series when the GST film thickness is set to (smaller than) 2 nm, it is possible to decrease the voltage decreased by the transistors to (smaller than) 1 V, and it is understood that the reset current is sufficiently supplied with a cell transistor configuration of the cell string. Preferably, the operation of 2 V or lower is desirable. In this case, the GST film thickness is set to 2 nm in the memory cell string of eight cells in series and the GST film thickness is set to 3 nm in the memory cell string of four cells in series.

Figure 10:
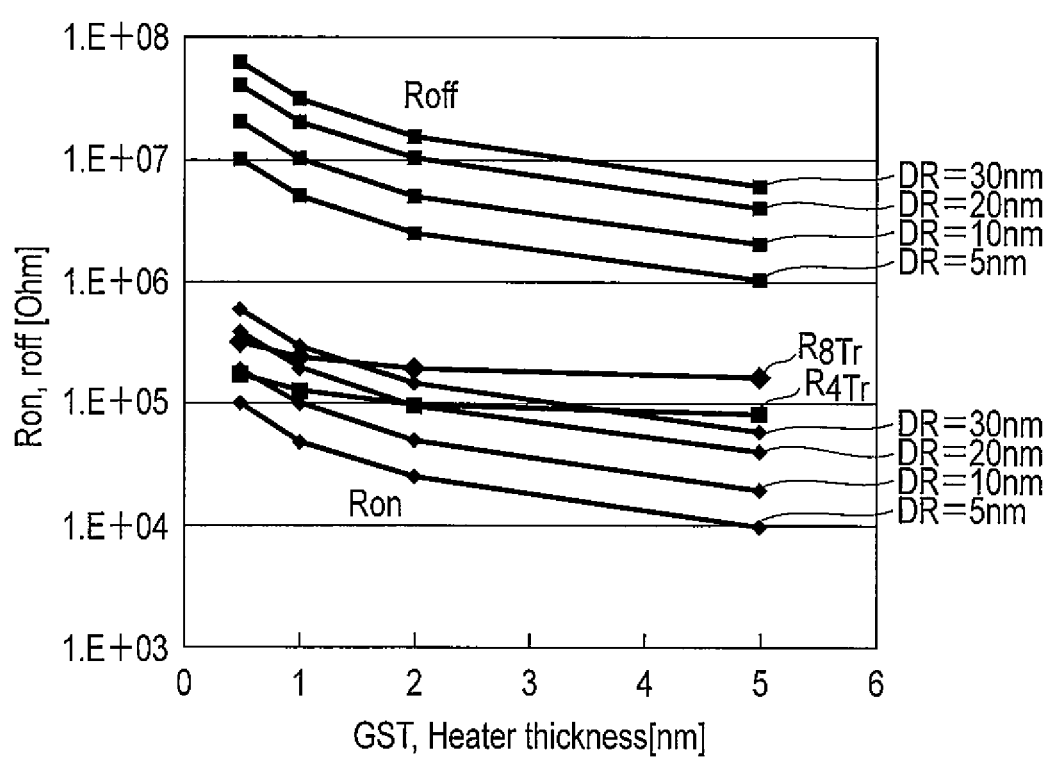
FIG. 10 illustrates ON/OFF resistance of the phase change resistance element and source/drain resistance of the non-selected cell according to the embodiment.

FIG. 10 illustrates analysis of resistance drop component in the read operation. Although the resistance in the amorphous state (Roff) and the crystal state (Ron) of the GST film changes by a value of DR, in each condition, a sum of the resistances of the cell transistor and the block select transistor is such that the value of Roff is two digits larger and is the value equivalent to Ron. That is to say, at the read time, in the Roff state, the flowing current is substantially limited by the GST film and also in the Ron state, this is substantially determined by the current flowing to the GST film, so that two-digit difference in current amount of the GST film may be maintained also in the memory cell string.

FIG. 11 illustrates an array configuration example, which may be applied to this embodiment. The bit line BL is connected to an amplifier of a read signal and a driver, which drives the bit line BL for the set/reset operation. The word line WL, the block select line BS, and the source line SL are connected to a row decoder including the drivers thereof. Although one amplifier and one driver are prepared for one bit line BL in this example, it is easy to thin out the selected bit line BL as illustrated in the operation example, so that it is also easy that a plurality of bit lines BL share them.

FIGS. 12A and 12B illustrate a read amplifier circuit example, which may be applied to this embodiment. In this embodiment, when it is wanted that an array mat is significantly increased while a high speed is not necessary as a substitute of an NAND, a method illustrated in FIGS. 12A and 12B may be applied to this embodiment.

In FIG. 12A, a BLSA is first precharged to VINT and the bit line BL is precharged to Vx potential with a threshold drop; in a case in which cell resistance is low, BL charge flows to the source line SL, but decrease in the BL potential is small due to a large capacity of the bit line BL; however, charge of a node BLSA on a sense amplifier side is transferred by the charge lost from the bit line BL due to the threshold drop of the transistor of Vx, and the potential of the BLSA is significantly decreased due to the small capacity of the BLSA. This is amplified by an amplifier circuit and stable operation is realized.

In FIG. 12B, feedback is applied such that the BL potential is maintained at the same potential as VBLH potential at a gate of a PMOS driver. In this case also, the potential of the BLSA is significantly decreased by the charge lost from the bit line BL, and this value is amplified by the amplifier and stable operation is realized. In this manner, also when the node of the BLSA is kept at a constant current or when this is precharged to VINT, amplitude of the node of the BLSA may be increased and the stable operation may be realized also with a large cell array supporting large capacity.

FIGS. 13A and 13B illustrate a BL driver, which enables the reset/set operation to realize multi-level writing, which may be applied to this embodiment. By making reference potential of Vreset_ref and Vset_ref and performing pentode operation, it is possible to apply the constant current. A switch is connected thereto in series to control ON/OFF of the current.

It is possible to change a set current value by first setting Vreset_on to LOW to put into a reset state, and thereafter preparing transistors in series having different sizes, and a multi-level cell having different phase change resistance values as in FIG. 13A may be realized. It goes without saying that a binary cell may be easily realized. It is possible to first reset and gradually set and it is also possible to first set and gradually reset.

Figure 14:
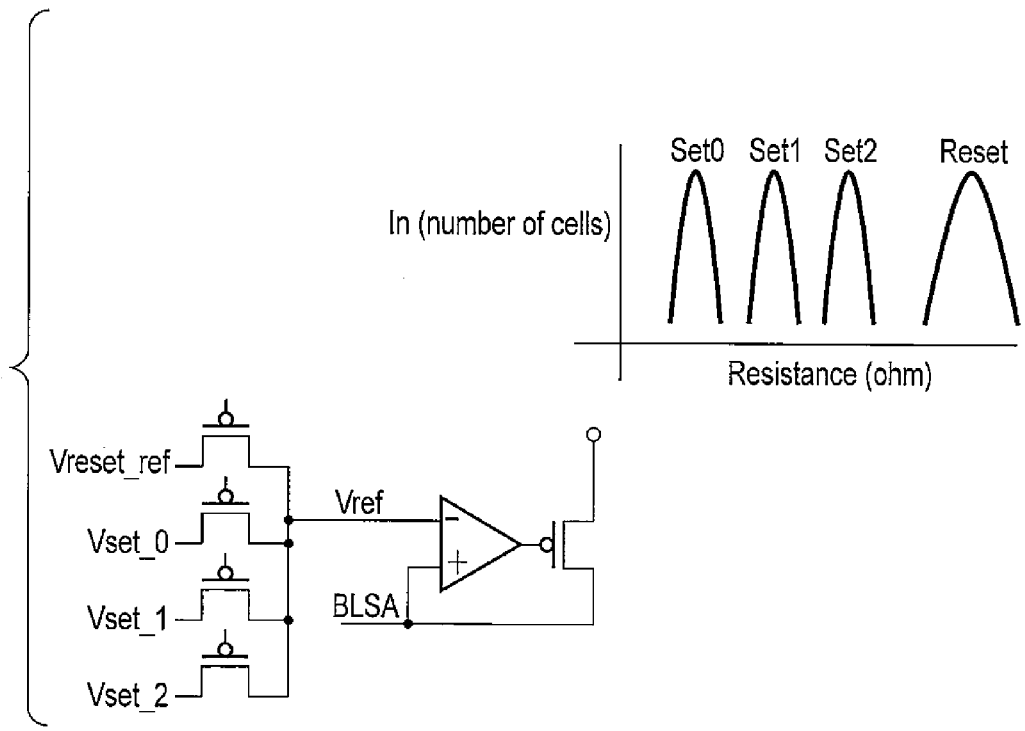

FIG. 14 illustrates an example of controlling multi-level reset/set operation by changing the voltage to be applied between the bit line BL and the source line SL. It is possible to easily perform multi-level writing by changing the voltage of the BLSA to reset, set0, set1, and set2 by selecting the value of Vref.

Figure 15A:
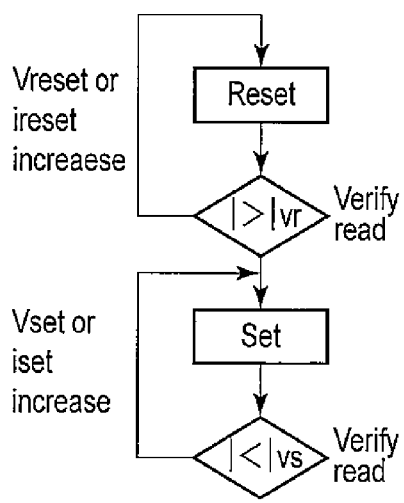
FIGS. 15A and 15B illustrate operation algorithms of Reset-Verify Read and Set-Verify Read according to the first embodiment.
Figure 15B:
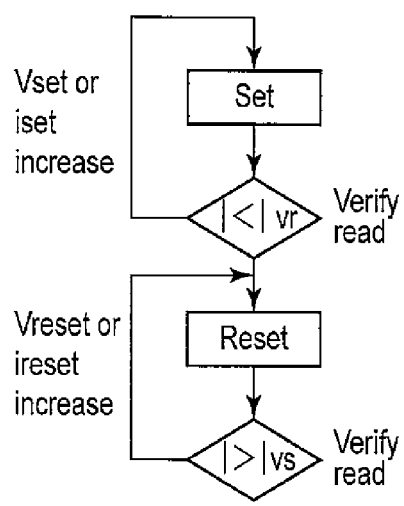

FIGS. 15A and 15B illustrate algorithms of Program/VerifyRead, which may be applied to this embodiment when resistance distribution of the cell is spread due to the miniaturization and it is difficult to realize the multi-level and the binary.

In FIG. 15A, the reset operation is first performed, and when the current, which flows to the resistance, is large in VerifyRead operation, this is executed again after the current between the bit line BL and the source line SL is increased. This is executed until the current becomes smaller than the reference current. Next, also in the set operation, it is first set and when the current, which flows to the resistance, is small in the VerifyRead operation, this is executed again after the current between the bit line BL and the source line SL is increased. This is executed until the current becomes larger than the reference current. It goes without saying that this may be applied to the multi-level writing, and it is compared with the reference corresponding to a multi-level state for each bit line BL and if it is not achieved, this may be performed again. An achieved bit is not set or reset any more when the voltage between the bit line BL and the source line SL is set to 0V, so that there is not a problem.

FIG. 15B illustrates a case in which it is reset according to the multi-level after being set in reverse. The multi-level may be similarly realized.

Second Embodiment

Figure 16:
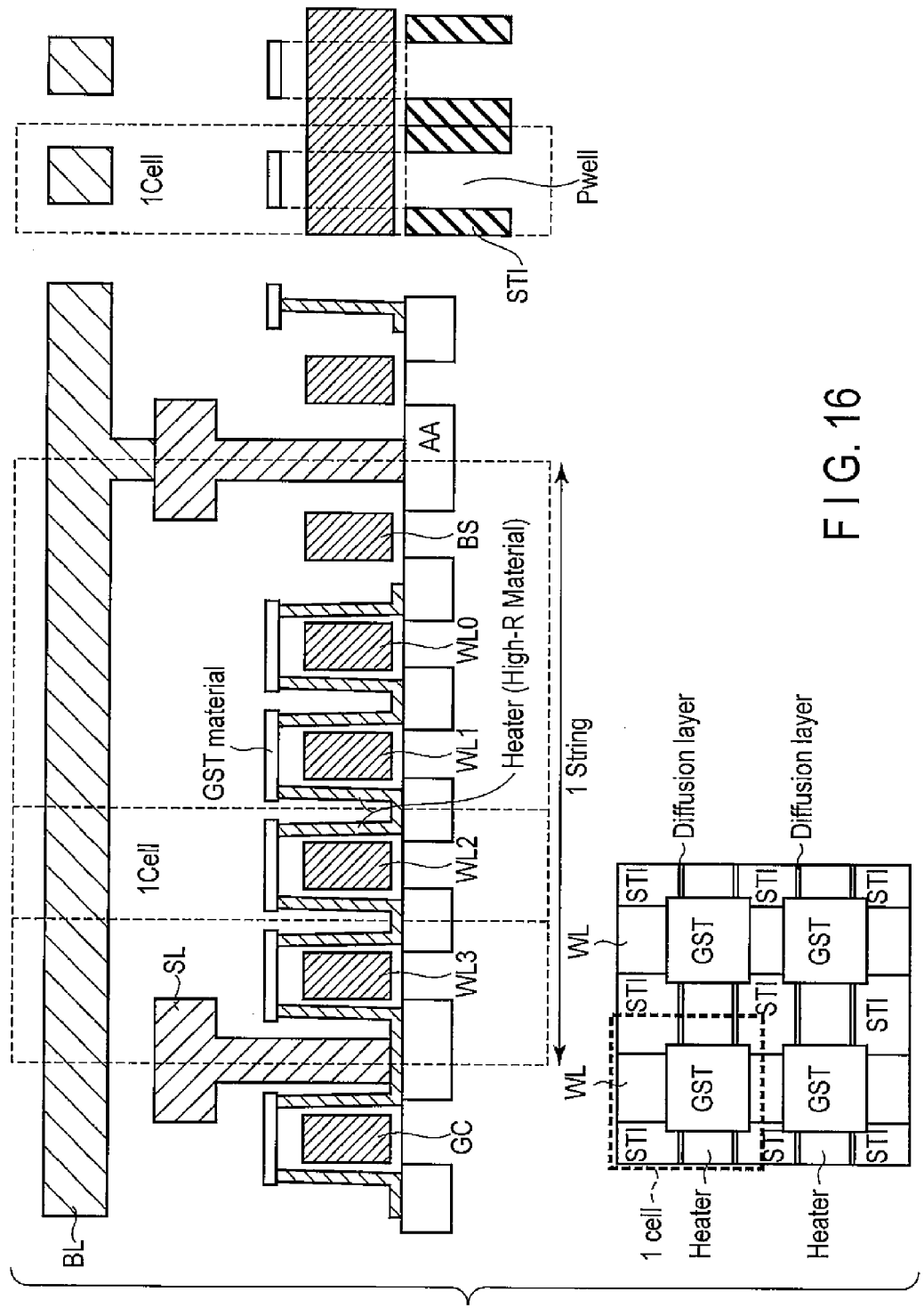
FIG. 16 illustrates a structure diagram of a memory cell string according to a second embodiment.

FIG. 16 illustrates a structure diagram of a memory cell string according to a second embodiment. An effect thereof is substantially the same as that in FIGS. 1 to 15. This is different in that a resistance element of a heater is removed by etching in a contact portion of a block select transistor and a bit line. An effect to decrease parasitic resistance of this portion is added.

Third Embodiment

Figure 17:
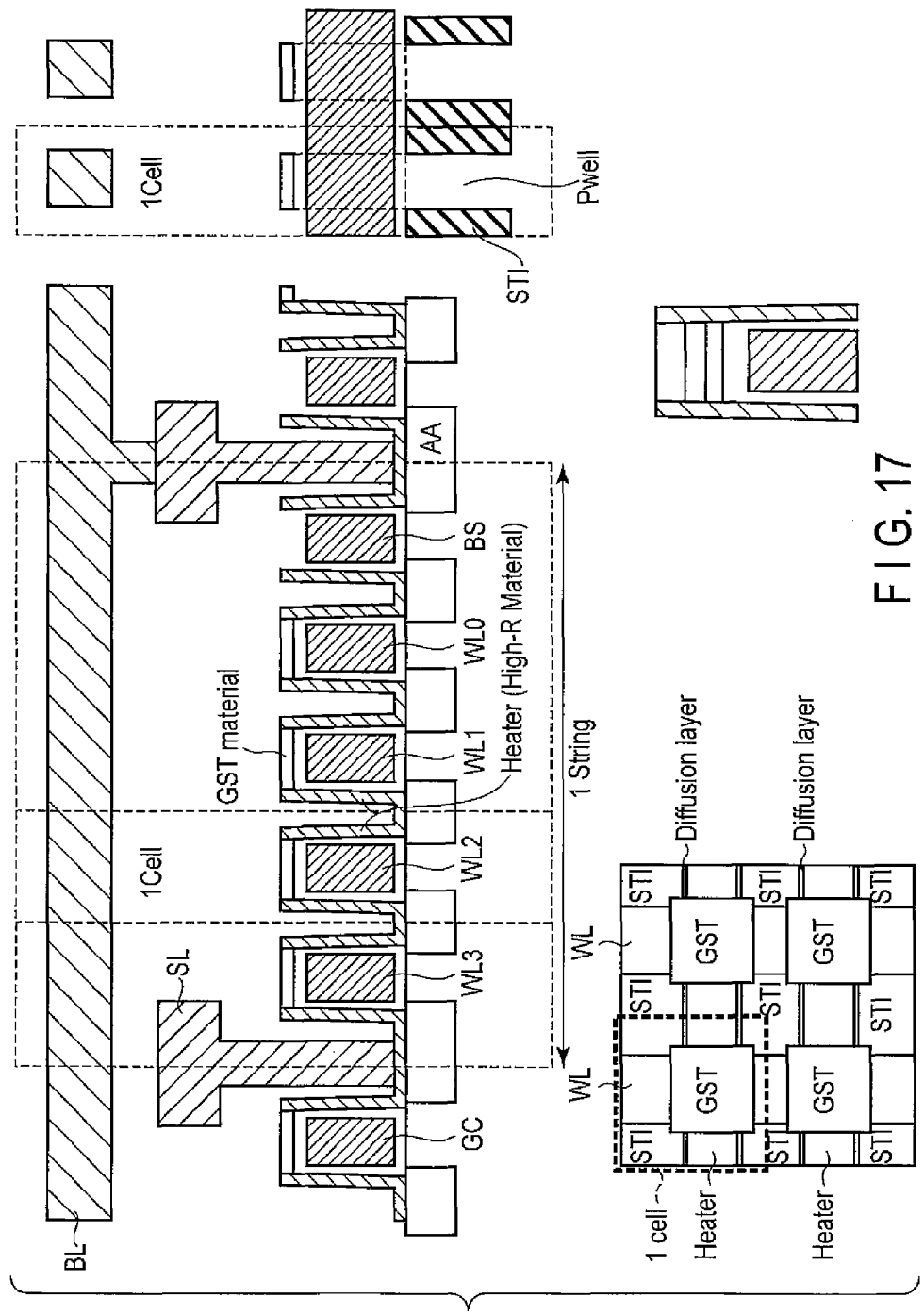

FIGS. 17A to 17C illustrate structure diagrams of a memory cell string according to a third embodiment. An effect thereof is substantially the same as that in FIGS. 1 to 15. This is different in that a GST film is also fabricated at the same time as gate fabrication after a gate is formed, an insulating film is deposited, and the GST film is deposited. Thereafter, the GST film on an STI other than a portion of a cell array is fabricated to be removed by another lithography. Thereafter, it is possible to realize a memory by forming a heater element on a gate side wall. An optimal process differs according to a design rule, so that the optimal process may be selected.

In FIG. 17C, by depositing a great number of GST films having different film thicknesses to change a distance from the heater, it is possible to easily realize a multi-level. This is because a reset current and a set current increase because an upper film has a larger cross section and is farther from the heater.

Fourth Embodiment

FIG. 18 illustrates a structure diagram of a memory cell string according to a fourth embodiment. An effect thereof is substantially the same as that in FIG. 17. This is different in that a resistance element of a heater is removed by etching in a contact portion of a block select transistor and a bit line. An effect to decrease parasitic resistance of this portion is added.

Fifth Embodiment

Figure 19:
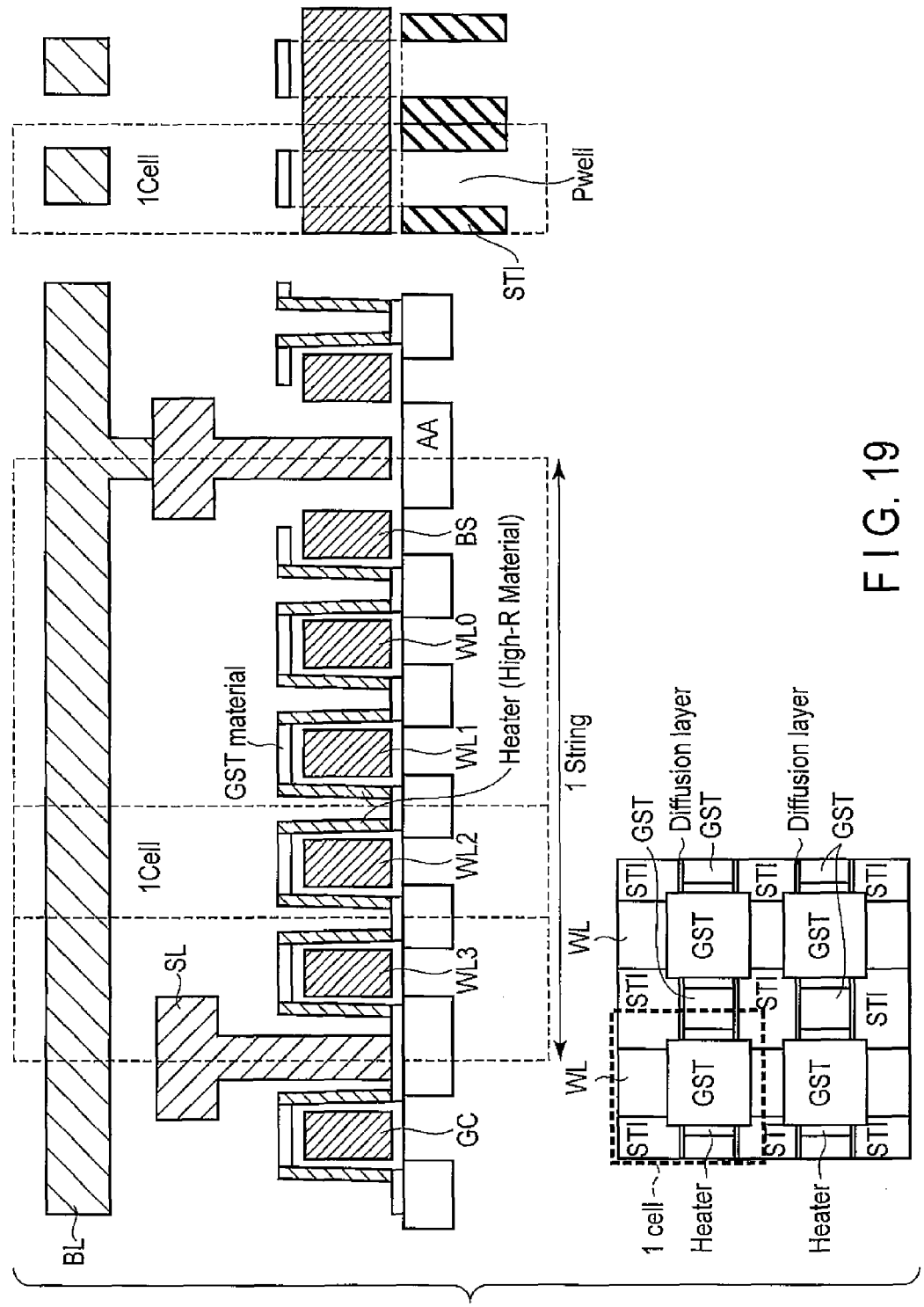

FIG. 19 illustrates a structure diagram of a memory cell string according to a fifth embodiment. An effect thereof is substantially the same as that in FIG. 17. This is different in that a GST film is formed not only on a gate but also on a diffusion layer. For example, when this is formed by a self-growth method and when this is formed by a sputtering method and a thickness of side wall formation is thin, it is possible to form the GST film only on a flat surface portion by performing etching a little.

Sixth Embodiment

Figure 20:
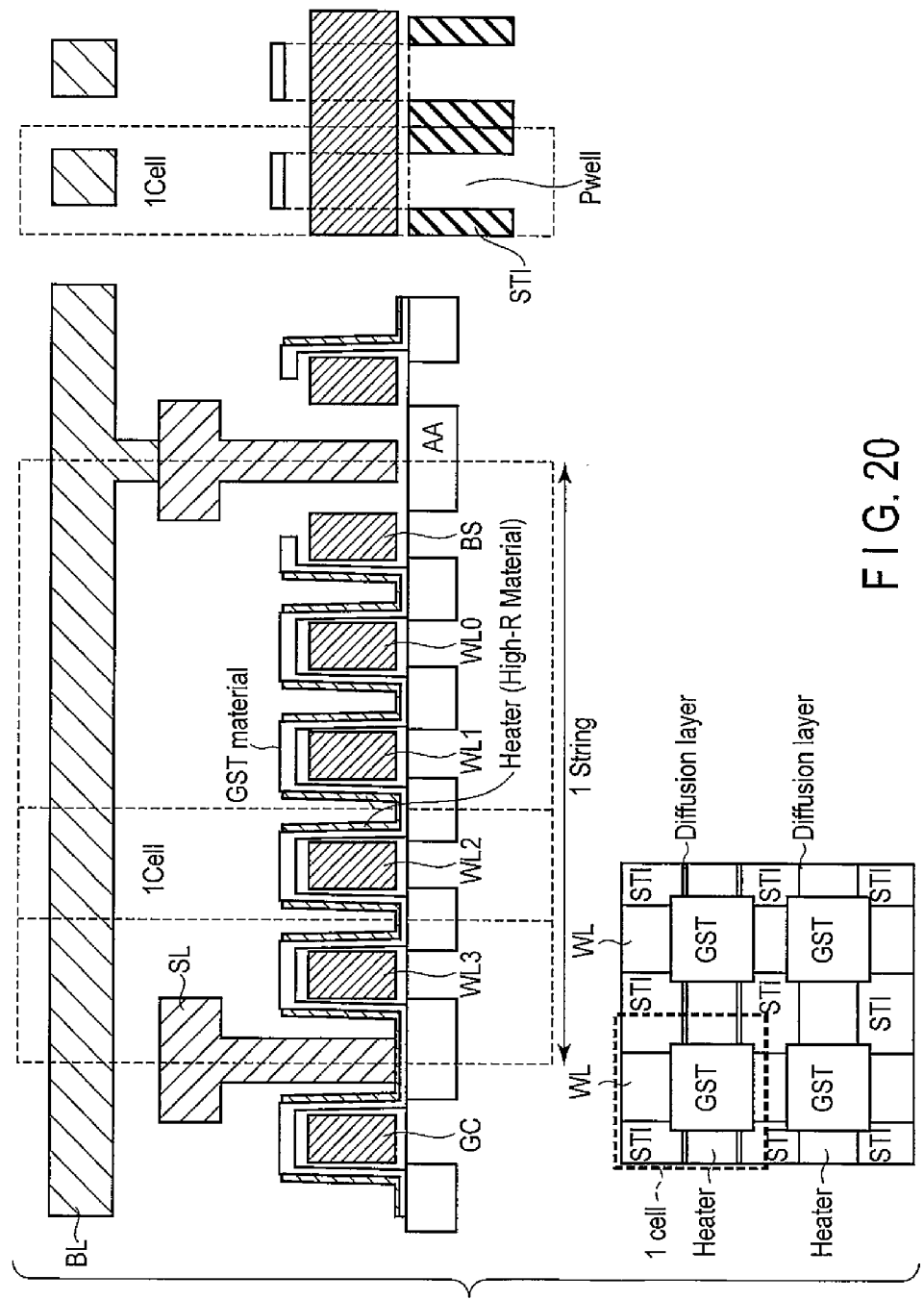

FIG. 20 illustrates a structure diagram of a memory cell string according to a sixth embodiment. An effect thereof is substantially the same as that in FIG. 17. This is different in that a GST film is formed not only on a gate but also on a side wall and a diffusion layer. Then, a heater element is formed on the side wall. Since the GST film also is a resistance element, when resistance of the heater is lower than a low-resistance state of the GST, the resistance becomes substantially constant regardless of the resistance state of the GST on the side wall, so that this may be used as the heater element.

Seventh Embodiment

FIG. 21 illustrates a structure diagram of a memory cell string according to a seventh embodiment. An effect thereof is substantially the same as that in FIGS. 1 to 20. This is different in that a cell transistor has a three-dimensional structure and that a channel is formed in lengthwise and crosswise directions in a word line direction. When an EOT of the transistor is set to approximately 1 nm, a size is not constrained also when a design rule is smaller than 10 nm, and it is possible to decrease a cell size. Accordingly, driving capacity of the cell transistor is significantly improved, the number of cells connected in series of the memory string may be significantly increased, a mean cell size may be decreased, and an IR-drop voltage due to a current, which flows through the cell transistor portion, may be decreased.

Eighth Embodiment

FIG. 22 illustrates a structure diagram of a memory cell string according to an eighth embodiment. An effect thereof is substantially the same as that in FIGS. 1 to 20. This is different in that a cell transistor has a three-dimensional structure and that a channel is formed in lengthwise and crosswise directions in a bit line direction. When an EOT of the transistor is set to approximately 1 nm, a size is not constrained also when a design rule is smaller than 10 nm, and it is possible to decrease a cell size. Accordingly, a short-channel effect of the cell transistor may be inhibited.

Ninth Embodiment

Figure 23:
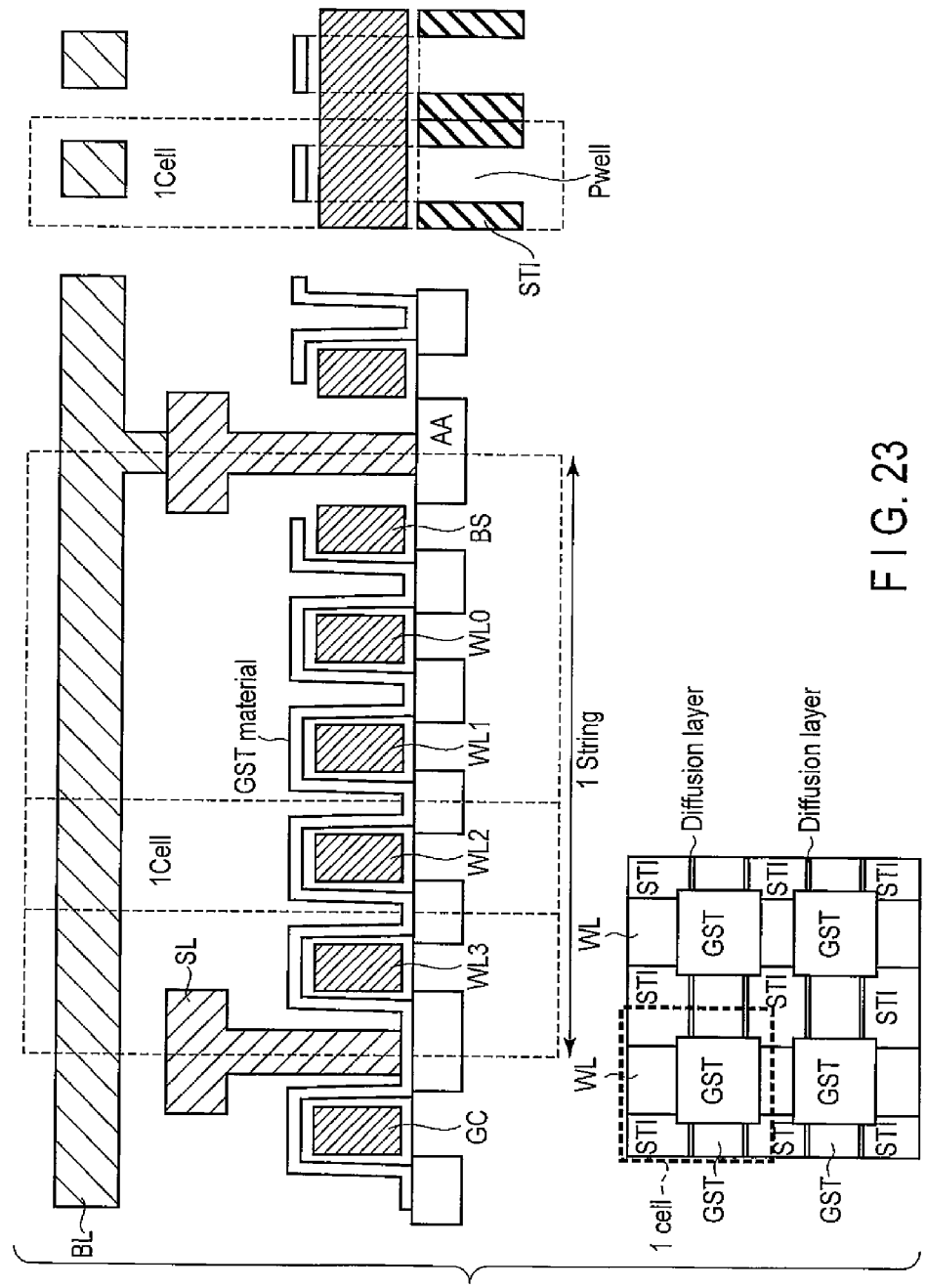

FIG. 23 illustrates a structure diagram of a memory cell string according to a ninth embodiment. An effect thereof is substantially the same as that in other embodiments. This is different in that a heater element is removed and a GST film is formed not only on a gate but also on a side wall and a diffusion layer. Since the GST film itself is a resistance element, this may perform set/reset operation by self-heating. A length of the GST film in a direction in which a current flows may be made three times or larger than that in other embodiments, so that it is effective in inhibiting a hopping path.

Tenth Embodiment

FIG. 24 illustrates a structure diagram of a memory cell string according to a tenth embodiment. This illustrates a case in which a resistance change memory is applied to the first embodiment. Although the resistance change memory does not have a heater, this may change resistance of a resistance element at read time by performing set operation and reset operation by changing a current to be applied to the resistance (unipolar operation) or to change the resistance of the resistance element at the read time by performing the set operation and the reset operation by changing polarity of the current to be applied to the resistance (bipolar operation).

Figure 25:
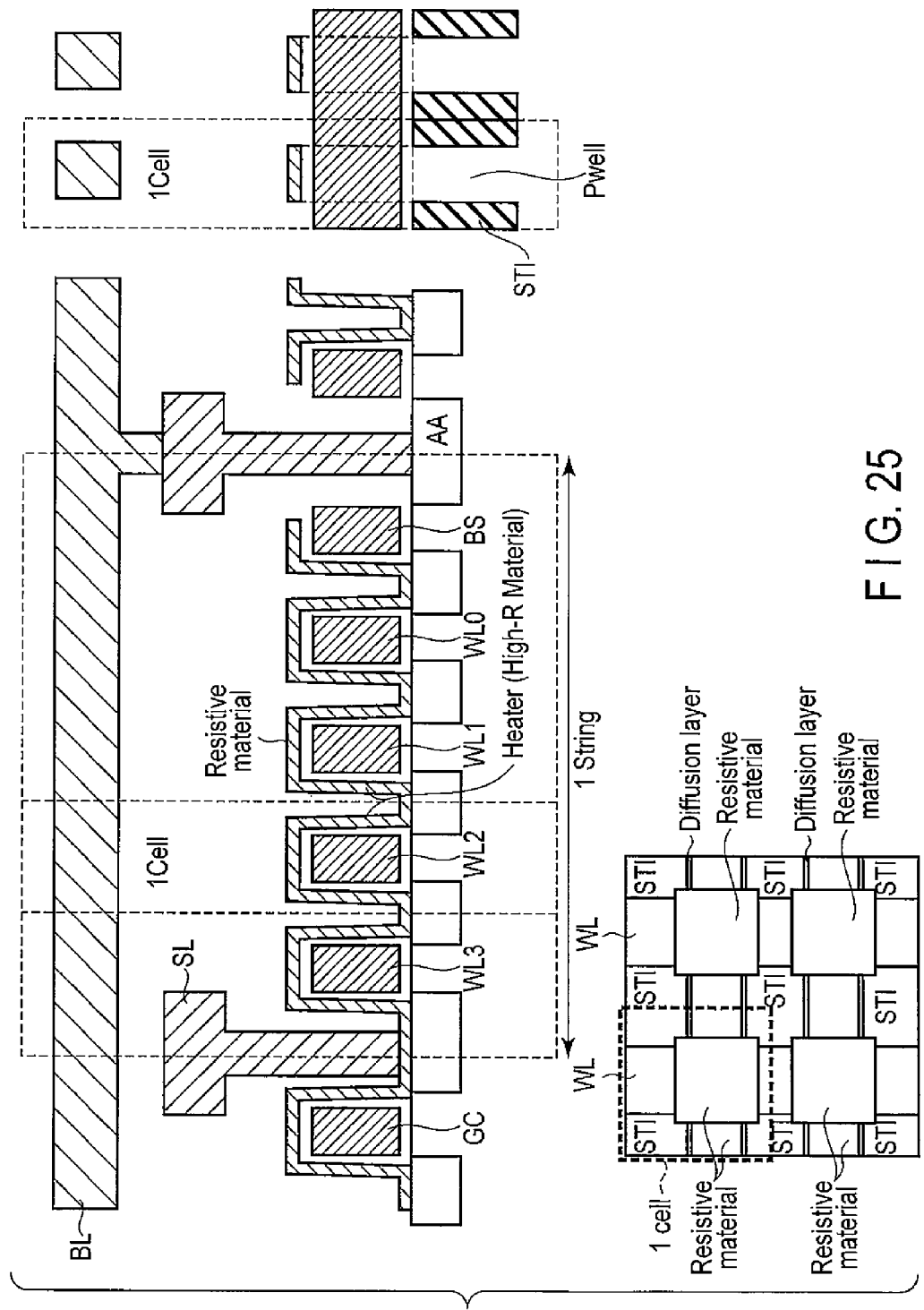

FIG. 25 illustrates a memory cell structure, which may be applied to this embodiment. A resistance change element is formed into a thin film on an insulating film of a gate and a side wall of the gate. Accordingly, it is possible to significantly decrease a reset current, a set current, and a read current irrespective of a design rule as in a case of a PRAM in the above-described embodiment. As a material of the resistance change element, which may be applied to this embodiment, binary oxides and ternary oxides such as NiO, WOx, HfO$_2$, ZnO$_2$, TiON, PrCaMnO$_3$, Ag-Gese, Cu-Gese, TaOx, FeO, GeO, STO, and CuSiO may be applied. As a material with which a low-resistance path is formed in the resistance change element by shift of the material of the element, the cell structure as in FIG. 24 is optimal.

FIG. 26 illustrates a case in which different electrodes are formed on source/drain portions and thereafter the resistance change element is formed thereon. The structure is optimal for a RRAM, which performs the bipolar operation. For example, when an Ag electrode is formed on one end of a resistance change film of GeSe, when a positive voltage is applied to a side of the Ag electrode, an Ag+ion moves into GeSe and resistance of a resistance change layer decreases, and when a negative voltage is applied, Ag+ is returned to the Ag side and the resistance of the resistance change layer increases. In this manner, this is suitable for a case in which Cu migration, oxygen vacancy migration and the like appear with the polarity. This is also suitable for a case in which the oxide is adhered only to one electrode to cause high resistance.

FIG. 27 illustrates a case in which the same electrodes are formed on the source/drain portions and thereafter the resistance change element is formed thereon. This structure is optimal for the RRAM, which performs the unipolar operation. It is necessary to form a filament such as forming.

Figure 28:
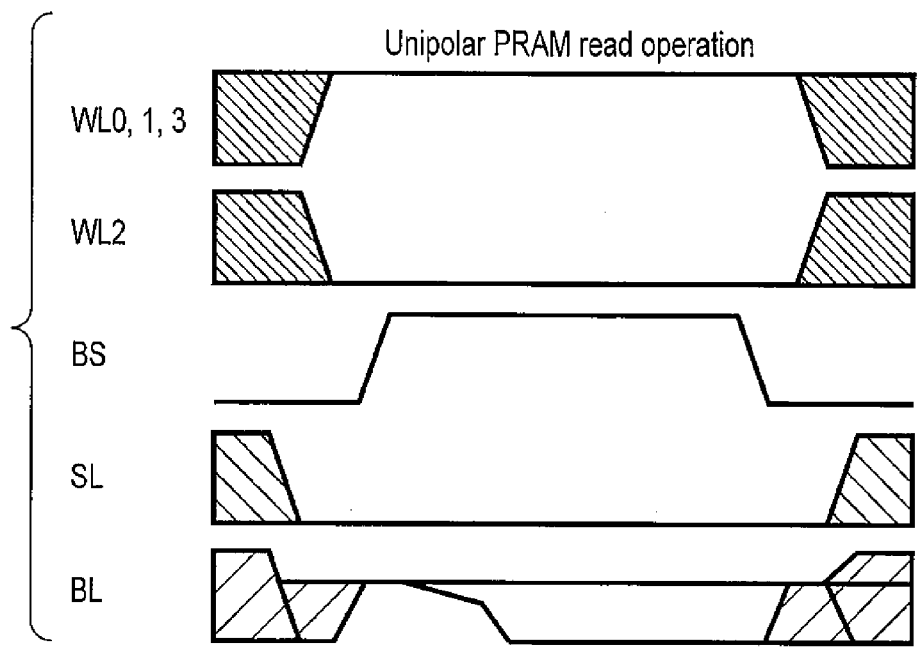
FIG. 28 illustrates a read operation example of a memory cell string of a unipolar element according to the tenth embodiment.
Figure 29:
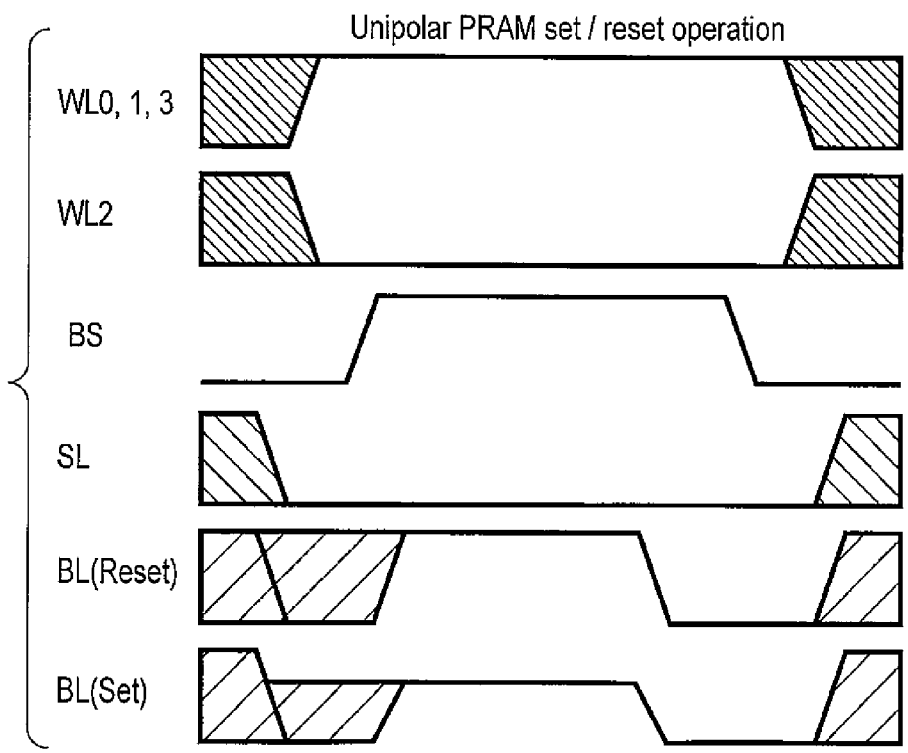
FIG. 29 illustrates a set/reset operation example of the memory cell string of the unipolar element according to the tenth embodiment.

FIGS. 28 and 29 illustrate read operation and the set/reset operation suitable for the unipolar operation. Basic operation is substantially the same as that in the PRAM and an effect thereof also is similar. This is different in that the operation is also performed with identical set time/reset time and it is possible to distinguish set and reset by only changing applied current and voltage.

Figure 30:
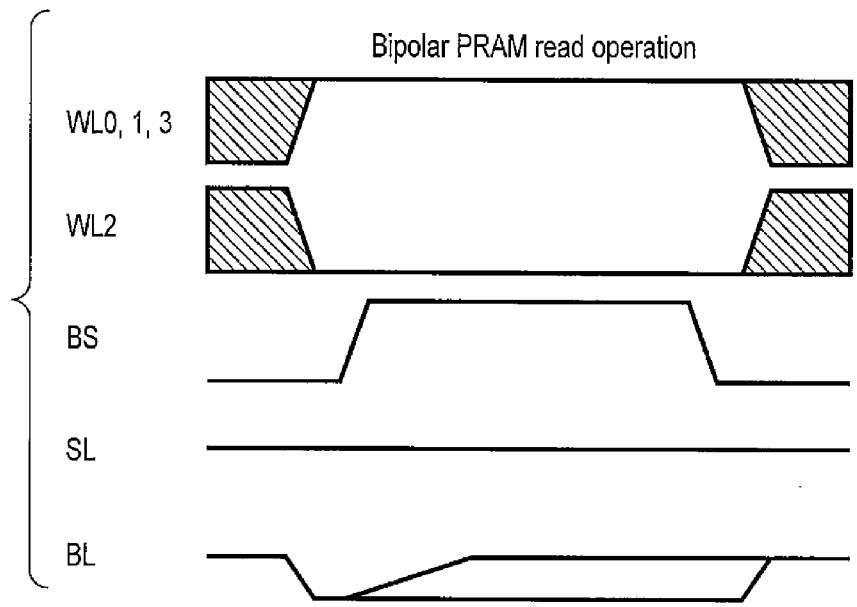
FIG. 30 illustrates a read operation example of a memory cell string of a bipolar element according to the tenth embodiment.
Figure 31:
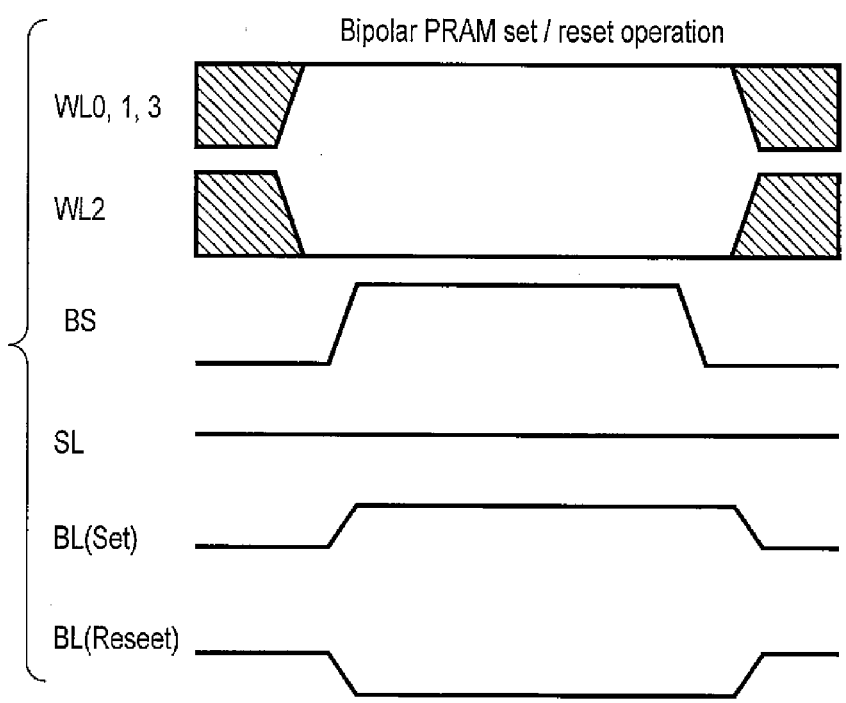
FIG. 31 illustrates a set/reset operation example of the memory cell string of the bipolar element according to the tenth embodiment.

FIGS. 30 and 31 illustrate the read operation and the set/reset operation suitable for the bipolar operation. Basic operation is substantially the same as that in the PRAM and an effect thereof also is similar. This is different in that a source line SL is set to a voltage value between VSS and a High voltage for changing the polarity of the current in the set time and the reset time, and this may be realized by setting a bit line voltage to High or Low in set and reset.

Eleventh Embodiment

FIG. 32 illustrates a circuit diagram of a memory cell string of a RRAM according to an eleventh embodiment. An effect thereof is substantially the same as that in FIGS. 24 to 31. This is different in that a resistance change element is sandwiched by resistance elements from both sides thereof.

Figure 33:
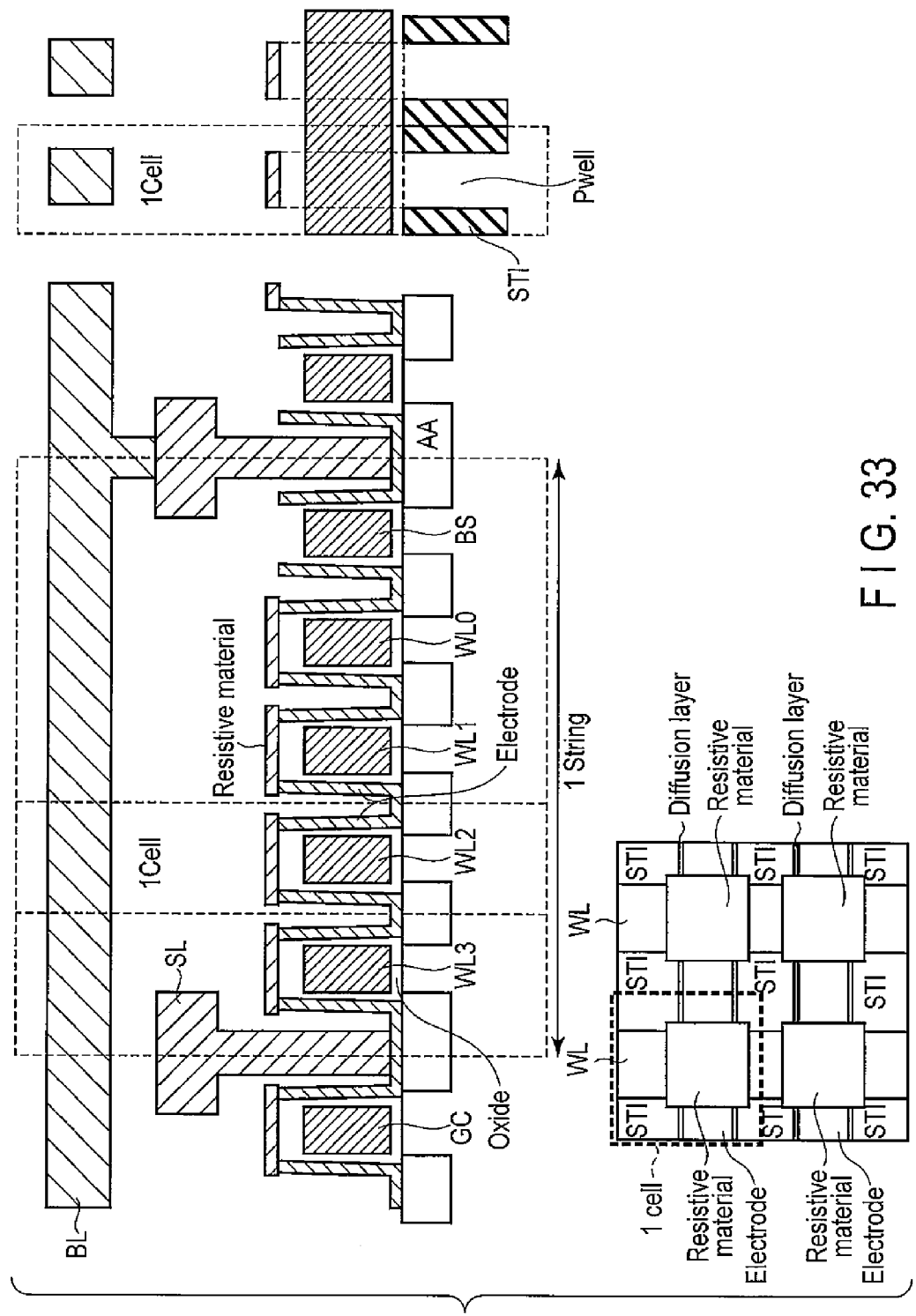
FIG. 33 illustrates a structure diagram of the memory cell string according to the eleventh embodiment.

FIG. 33 illustrates a structure diagram of the memory cell string of the RRAM, which realizes the circuit diagram in FIG. 32. An effect thereof is substantially the same as that in FIGS. 24 to 31. This is different in that a thin-film resistance change element is arranged on a gate and a resistance element is arranged on a side wall of the gate. The resistance element is desired to have low resistance as far as possible. By this configuration, it becomes possible to form the resistance change element on a flat surface to make a property stable and inhibit variation.

FIG. 34 illustrates a structure diagram of the memory cell string of the RRAM, which realizes the circuit diagram in FIG. 32. An effect thereof is substantially the same as that in FIGS. 24 to 31. This is different in that the thin-film resistance change element is arranged on the gate and electrode resistance elements of different materials are arranged on the side wall of the gate. The resistance element is desired to have the low resistance as far as possible. Bipolar operation may be performed with this configuration.

FIG. 35 illustrates a write current driver example to a bit line BL in a case of the bipolar operation, which realizes FIGS. 24 to 35. A source line SL is set to a certain voltage VSL, and in this example, a reset current is set to a constant current and potential of the bit line BL is dropped so as to be lower than VSL, and a plurality of constant currents may be selected as set currents and it is possible to increase the voltage of the bit line BL so as to be higher than VSL. Accordingly, it becomes possible to ensure a plurality of set states and multi-level operation becomes possible.

FIG. 36 illustrates a write voltage driver example to the bit line BL in the case of the bipolar operation, which realizes FIGS. 24 to 35. The source line SL is set to a certain voltage VSL, and in this example, a reset voltage is set to a constant voltage and the potential of the bit line BL is dropped so as to be lower than VSL, and a plurality of constant voltages may be selected as set voltages, and it is possible to increase the voltage of the bit line BL so as to be higher than VSL. Accordingly, it becomes possible to ensure a plurality of set states and the multi-level operation becomes possible.

As described above in detail, according to this embodiment, a phase change material is formed into the thin film on the gate of a cell transistor and both ends thereof are connected to a source and a drain of the cell transistor through a heater resistance element on a side wall of the cell transistor. Accordingly, chalcogenide glass, which is formed in a conventional contact, of which cross section is decreased with difficulty may be easily formed into the thin film, and further, since it is possible to form the heater element into the thin film, as a result, the cross sections of the phase change material and the heater element may be significantly decreased as compared to those of a conventional phase change memory and it is possible to realize a memory cell capable of significantly decreasing the write current (reset current and set current) and a read current.

Further, according to this embodiment, it is possible to heat by the heater from both sides of the phase change material and a heat confining effect acts, so that a lower current may be realized. As a result, the write current and the read current may be decreased such that driving by a minimum transistor becomes possible, and a substantially 4F2 memory cell may be realized.

Also, random access also becomes possible by an effect of a cell circuit configuration. Also, since a length of the phase change element of approximately a channel width of the gate may be ensured, the length through which the current flows may be ensured, and a problem of increase in the current due to parallelization of the hopping paths may be avoided.

Also, since a length of the heater element as long as a height of the gate may be ensured, heat interference generated by reset operation of an adjacent cell may be significantly decreased.

Further, since an area of the phase change material may be completely limited, insufficient crystal state and amorphous state may be prevented, and variation in resistance may also be decreased.

Similarly, when the RRAM using the resistance change element is realized also, the write current and a read current may be decreased by thin film formation of the resistance change element, and when the side wall also is made the resistance change element, a length of the resistance change element is further ensured and it is possible to decrease the current and decrease the variation.

A unipolar element may realize the set operation and the reset operation by changing an amount of the current applied to the bit line and a bipolar element may easily realize the reset operation and the set operation by increasing or decreasing the bit line voltage relative to the source line voltage. Further, there is not a problem of a boundary of the amorphous state and the crystal state of a conventional hemispherical GST, the length of the phase change resistance element is limited and an entire inside is easily set to the amorphous state or the crystal state, so that this is resistant to variation. Also, multi-level storage may be easily realized.

In other words, according to this embodiment, the phase change material is formed into the thin film on the gate of the cell transistor and the both ends thereof are connected to the source and the drain of the cell transistor through the heater resistance element on the side wall of the cell transistor. Accordingly, the chalcogenide glass, which is formed in a conventional contact, of which cross section is decreased with difficulty may be easily formed into the thin film, and further, it is possible to form the heater element into the thin film, so that the cross sections of the phase change material and the heater element may be significantly decreased as compared to those of a conventional phase change memory and it is possible to realize the memory cell capable of significantly decreasing the write current (reset current and set current) and the read current as a result. Further, it is possible to heat by the heater from the both sides of the phase change material, the heat confining effect acts, so that it becomes possible to realize the amorphous state (reset) and the crystal state (set) at a lower current. As a result, it is possible to decrease the write current and the read current such that the driving by the minimum transistor becomes possible. Accordingly, an IR-drop of the bit line is decreased and an array size may be enlarged. Further, since the thin-film heater element is formed on the side wall of the cell transistor, a cell size in a bit line direction is substantially determined by line/space (2F) of a gate wiring (word line) of the cell transistor and the cell size in a word line direction is determined by line/space (2F) of a diffusion layer (AA) and a shallow trench isolation (STI), so that the substantially 4F2 memory cell may be realized.

Also, since the word line connected to the gate of a selected cell transistor is set to low and another word line and a block select line are set to HIGH, when the voltage is applied between the source line and the bit line, the voltage is applied only to the phase change material of an optional cell of the memory cell string, so that the random access also becomes possible. It is possible to judge 0, 1 and the like by a flowing current. This is similar in writing, and it is possible to heat only the phase change material of the selected cell by the heater and transition between the amorphous state and the crystal state becomes possible.

Also, since the length of the phase change element of approximately the channel width of the gate may be ensured, the length through which the current flows may be ensured, and the problem of increase in the current due to the parallelization of the hopping paths may be avoided.

Also, since the length of the heater element as long as the height of the gate may be ensured, the heat interference generated by the reset operation of the adjacent cell may be significantly decreased. Further, since the area of the phase change material may be completely limited, the insufficient crystal state and amorphous state may also be prevented, and the variation in resistance may be decreased.

Similarly, when the RRAM using the resistance change element is realized also, the write current and the read current may be decreased by the thin film formation of the resistance change element, and when the side wall also is made the resistance change element, the length of the resistance change element is further ensured, so that it is possible to decrease the current and decrease the variation. The unipolar element may realize the set operation and the reset operation by changing the amount of current to be applied to the bit line and the bipolar element may realize the reset operation and the set operation more easily by increasing or decreasing the bit line voltage relative to the source line voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A phase change memory comprising:
a first memory cell comprising a chalcogenide wiring, resistance wirings, which become a heater, of which each of one end is connected to each of both ends of the chalcogenide wiring, and a first cell transistor to a source and a drain of which the other ends of resistance wirings are connected, a physical arrangement direction of the chalcogenide wiring being different from that of the resistance wirings;
a block select transistor to a source of which one end of a plurality of memory cells with sources and drains connected in series is connected and to a drain of which a bit line is connected; and
a memory cell array obtained by forming the memory cell strings by connecting the other end of the memory cells connected in series to a source line, connecting a gate of the memory cell to a word line, and connecting a gate of the block select transistor to a block select line, and by arranging a plurality of memory cell strings,
wherein a gate of the first cell transistor has two side walls corresponding only to it, and
wherein the resistance wirings, which become the heater, are respectively formed on the two side walls of the gate of the first cell transistor and the chalcogenide wiring is formed over the resistance wirings above the gate of the first cell transistor, and two ends of the chalcogenide wiring are respectively connected to the resistance wirings formed on the two side walls of the gate of the first cell transistor.

2. The memory according to claim 1, wherein
the chalcogenide wiring is formed on a gate of the first cell transistor through an insulating film, and
a direction in which the both ends of the chalcogenide wiring are connected is parallel to a wiring direction of the bit line.

3. The memory according to claim 2, wherein
a direction in which the both ends of the resistance wiring, which becomes the heater is connected, is perpendicular to the wiring direction of the bit line.

4. The memory according to claim 1, wherein
the chalcogenide wiring is formed after resistance elements, which become the heater, are formed on side walls of the gate of the first cell transistor.

5. The memory according to claim 4, wherein
at read operation time, the word line connected to a selected cell of a selected memory cell string is set to LOW, the word line connected to a non-selected cell of the selected memory cell string is set to HIGH, and the block select line of the selected memory cell string is set to HIGH, thereby providing potential difference between the source line and the bit line to read cell data by difference in a current, which flows to the memory cell.

6. The memory according to claim 4, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby differentiating an amount of current, which flows between the source line and the bit line, to realize transition to low resistance and high resistance of a resistance change material of the selected memory cell.

7. The memory according to claim 4, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby changing a polarity of a current, which flows between the source line and the bit line, to realize transition to low resistance and high resistance of the resistance change material of the selected memory cell.

8. The memory according to claim 4,
wherein the resistance elements are formed on side wall of the gate simultaneously.

9. The memory according to claim 4, further comprising:
a second memory cell comprising a chalcogenide wiring, resistance wirings, which becomes a heater, of which each of one end is connected to each of both ends of the chalcogenide wiring, and a second cell transistor to a source and a drain of which the other ends of resistance wirings are connected,
wherein two resistance wirings are formed between the first cell transistor and the second cell transistor.

10. The memory according to claim 1, wherein the chalcogenide wiring is formed on the gate of the first cell transistor, and thereafter resistance elements, which become the heater, are formed on side walls of the gate of the first cell transistor.

11. The memory according to claim 1, wherein
resistance of the chalcogenide wiring is stored as 2 to the power of N (N is a natural number not smaller than 1) types and N bits are stored in the chalcogenide wiring.

12. The memory according to claim 1, wherein
at read operation time, the word line connected to a selected cell of a selected memory cell string is set to LOW, the word line connected to a non-selected cell of the selected memory cell string is set to HIGH, and the block select line of the selected memory cell string is set to HIGH, thereby providing potential difference between the source line and the bit line to read cell data by difference in a current, which flows to the memory cell.

13. The memory according to claim 1, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby differentiating an amount of current, which flows between the source line and the bit line, and time during which the current is applied to realize transition to an amorphous state and a crystal state of the chalcogenide wiring of the selected memory cell.

14. The memory according to claim 1,
wherein the source and drain are in a Si-substrate, and
an insulating layer is formed between chalcogenide wiring, resistance wirings and the bit.

15. A phase change memory comprising:
a memory cell comprising a first chalcogenide wiring, a second chalcogenide wiring, a third chalcogenide wiring, and a first cell transistor to a source and a drain of which both ends of the second and third chalcogenide wirings are connected, each end of the first chalcogenide wiring being connected to each end of the second chalcogenide wiring and the third chalcogenide wiring, a physical arrangement direction of the first chalcogenide wiring being different from those of the second chalcogenide wiring and the third chalcogenide wiring;

a block select transistor to a source of which one end of a plurality of memory cells with sources and drains connected in series is connected and to a drain of which a bit line is connected; and a memory cell array obtained by forming a memory cell string by connecting the other end of the memory cells connected in series to a source line, connecting a gate of the memory cell to a word line, and connecting a gate of the block select transistor to a block select line, and by arranging a plurality of memory cell strings, wherein a gate of a first cell transistor has two side walls corresponding only to it, and wherein the second and third chalcogenide wirings are respectively formed on the two side walls of the gate of the first cell transistor and the first chalcogenide wiring is formed over the second and third chalcogenide wirings above the gate of the first cell transistor, and two ends of the first chalcogenide wiring are respectively connected to the second and third chalcogenide wirings formed on the two side walls of the gate of the first cell transistor.

16. The memory according to claim 15, wherein
the chalcogenide wiring is formed on a gate of the cell transistor through an insulating film, and
a direction in which the both ends of the chalcogenide wiring are connected is parallel to a wiring direction of the bit line.

17. The memory according to claim 15, wherein
at read operation time, the word line connected to a selected cell of a selected memory cell string is set to LOW, the word line connected to a non-selected cell of the selected memory cell string is set to HIGH, and the block select line of the selected memory cell string is set to HIGH, thereby providing potential difference between the source line and the bit line to read cell data by difference in a current, which flows to the memory cell.

18. The memory according to claim 15, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby differentiating an amount of current, which flows between the source line and the bit line, and time during which the current is applied to realize transition to an amorphous state and a crystal state of the chalcogenide wiring of the selected memory cell.

19. The memory according to claim 15, further comprising:
a second memory cell comprising a first chalcogenide wiring, a second chalcogenide wiring, a third chalcogenide wiring and a second cell transistor to a source and a drain of which both ends of the second and third chalcogenide wirings are connected, each of one end of the first chalcogenide wiring being connected to each of one end of the second chalcogenide wiring and the third chalcogenide wiring, the physical arrangement direction of the first chalcogenide wiring be different from that of the second chalcogenide wiring and the third chalcogenide wiring,
wherein the second chalcogenide wiring corresponding to the first memory and the third chalcogenide wiring corresponding to the second memory are formed between the first cell transistor and the second cell transistor.

20. The memory according to claim 15,
wherein the source and drain are in a Si-substrate, and
an insulating layer is formed between the first chalcogenide wiring the second chalcogenide wiring, the third chalcogenide wiring and the bit.

21. A resistance change memory comprising:
a first memory cell comprising a resistance change material wiring, first and second metal wirings one ends of which are connected to both ends of the resistance change material wiring, respectively, and a first cell transistor to a source of which the other end of the first metal wiring is connected and to a drain of which the other end of the second metal wiring is connected, a physical arrangement direction of the resistance change material wiring being different from those of the first and second metal wirings;

a block select transistor to a source of which one end of a plurality of memory cells with sources and drains connected in series is connected and to a drain of which a bit line is connected; and a memory cell array obtained by forming a memory cell string by connecting the other end of the memory cells connected in series to a source line, connecting a gate of the memory cell to a word line, and connecting a gate of the block select transistor to a block select line, and by arranging a plurality of memory cell strings, wherein a gate of the first cell transistor has two side walls corresponding only to it, and wherein the first and second metal wirings are respectively formed on the two side walls of the gate of the first cell transistor and the resistance change material wiring is formed over the first and second metal wirings above the gate of the first cell transistor, and two ends of the resistance change material wiring are respectively connected to the first and second metal wirings formed on the two side walls of the gate of the first cell transistor.

22. The memory according to claim 21, wherein
the resistance change material wiring is formed on a gate of the cell transistor through an insulating film, and
a direction in which the both ends of the resistance change material wiring is connected is parallel to a wiring direction of the bit line.

23. The memory according to claim 22, wherein
a direction in which the both ends of the first metal wiring are connected is perpendicular to the wiring direction of the bit line.

24. The memory according to claim 21, wherein
at read operation time, the word line connected to a selected cell of a selected memory cell string is set to LOW, the word line connected to a non-selected cell of the selected memory cell string is set to HIGH, and the block select line of the selected memory cell string is set to HIGH, thereby providing potential difference between the source line and the bit line to read cell data by difference in a current, which flows to the memory cell.

25. The memory according to claim 21, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby differentiating an amount of current, which flows between the source line and the bit line, to realize transition to low resistance and high resistance of a resistance change material of the selected memory cell.

26. The memory according to claim 21, wherein
at write operation time, the word line connected to a selected cell of a selected memory cell string is set to LOW, the word line connected to a non-selected cell of the selected memory cell string is set to HIGH, and the block select line of the selected memory cell string is set to HIGH, thereby changing a polarity of a current, which flows between the source line and the bit line, to realize transition to low resistance and high resistance of the resistance change material of the selected memory cell.

27. The memory according to claim 21,
wherein the resistance change material wiring is formed after the first and second metal wirings are formed on a side wall of a gate of the first cell transistor
wherein the first and second metal wirings are formed on side wall of the gate simultaneously.

28. The memory according to claim 21, further comprising:
a second memory cell comprising a resistance change material wiring, first and second metal wirings one ends of which are connected to both ends of the resistance change material wiring, respectively, and a second cell transistor to a source of which the other end of the first metal wiring is connected and to a drain of which the other end of the second metal wiring is connected,
wherein the first metal wirings corresponding to the first memory and the second metal wirings corresponding to the second memory are formed between the first cell transistor and the second cell transistor.

29. The memory according to claim 21,
wherein the source and drain are in a Si-substrate, and
an insulating layer is formed between a resistance change material wiring, first and second metal wirings and the bit.

* * * * *